United States Patent
Inoue et al.

(10) Patent No.: US 9,529,033 B2
(45) Date of Patent: Dec. 27, 2016

(54) GROUND LEAKAGE DETECTOR, AND METHOD OF DETECTING GROUND LEAKAGE IN ELECTRIC VEHICLE

(75) Inventors: Masafumi Inoue, Miki (JP); Yoshimoto Matsuda, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 251 days.

(21) Appl. No.: 14/368,776

(22) PCT Filed: Dec. 26, 2011

(86) PCT No.: PCT/JP2011/007278
§ 371 (c)(1),
(2), (4) Date: Aug. 6, 2014

(87) PCT Pub. No.: WO2013/098876
PCT Pub. Date: Jul. 4, 2013

(65) Prior Publication Data
US 2014/0368211 A1    Dec. 18, 2014

(51) Int. Cl.
*G01R 31/02* (2006.01)
*B60L 3/00* (2006.01)
(Continued)

(52) U.S. Cl.
CPC .......... *G01R 31/025* (2013.01); *B60L 3/0046* (2013.01); *B60L 3/0069* (2013.01); *B60L 3/04* (2013.01);
(Continued)

(58) Field of Classification Search
CPC ..... G01R 31/02; G01R 31/024; G01R 31/025; G01R 31/3008; G01R 31/005; G01R 31/006; G01R 31/28; G01R 19/16571; B60L 3/0069; H03K 2217/9605; B60R 2021/0115
See application file for complete search history.

(56) References Cited

U.S. PATENT DOCUMENTS

| | | | |
|---|---|---|---|
| 6,970,807 B2 | 11/2005 | Kito et al. | |
| 2009/0278547 A1 | 11/2009 | Acena et al. | |
| 2010/0052419 A1* | 3/2010 | Oosawa | B60L 3/0046 307/10.1 |

FOREIGN PATENT DOCUMENTS

| JP | 06062524 A | 3/1994 |
|---|---|---|
| JP | 06153303 A | 5/1994 |

(Continued)

OTHER PUBLICATIONS

European Patent Office, Extended European Search Report Issued in Application No. 11878743.1, Nov. 24, 2015, 12 pages.
(Continued)

*Primary Examiner* — Son Le
(74) *Attorney, Agent, or Firm* — Alleman Hall McCoy Russell & Tuttle LLP

(57) ABSTRACT

A ground leakage detector for detecting a ground leakage in an electric vehicle including a battery, and a charging connector which is electrically connectable to a terminal member formed at one end of an outside electric wire through which electric power is supplied from outside to the battery, includes a connector connection section electrically connectable to the charging connector; a contactor configured to contact a vehicle body ground location in the electric vehicle; and a detecting circuit for detecting whether or not there is a ground leakage from the battery to the vehicle body ground location, based on a current flowing between the connector connection section and the contactor.

11 Claims, 11 Drawing Sheets

(51) Int. Cl.
*B60L 3/04* (2006.01)
*B60L 11/16* (2006.01)
*B60L 11/18* (2006.01)
*B60L 3/12* (2006.01)
*B60L 11/14* (2006.01)
*G01R 35/00* (2006.01)
*G01R 31/00* (2006.01)

(52) U.S. Cl.
CPC .............. *B60L 3/12* (2013.01); *B60L 11/14* (2013.01); *B60L 11/16* (2013.01); *B60L 11/1803* (2013.01); *B60L 11/1816* (2013.01); *B60L 11/1861* (2013.01); *B60L 11/1864* (2013.01); *B60L 11/1868* (2013.01); *B60L 11/1877* (2013.01); *G01R 31/005* (2013.01); *G01R 35/00* (2013.01); *B60L 2200/12* (2013.01); *B60L 2200/32* (2013.01); *B60L 2210/10* (2013.01); *B60L 2210/30* (2013.01); *B60L 2210/40* (2013.01); *B60L 2240/545* (2013.01); *B60L 2240/547* (2013.01); *B60L 2240/549* (2013.01); *B60L 2240/80* (2013.01); *B60L 2250/10* (2013.01); *B60L 2250/16* (2013.01); *B60L 2250/24* (2013.01); *G01R 31/006* (2013.01); *Y02T 10/70* (2013.01); *Y02T 10/7005* (2013.01); *Y02T 10/7044* (2013.01); *Y02T 10/7061* (2013.01); *Y02T 10/7066* (2013.01); *Y02T 10/7072* (2013.01); *Y02T 10/7077* (2013.01); *Y02T 10/7216* (2013.01); *Y02T 10/7241* (2013.01); *Y02T 90/127* (2013.01); *Y02T 90/14* (2013.01)

(56) References Cited

FOREIGN PATENT DOCUMENTS

| | | |
|---|---|---|
| JP | 2003151085 A | 5/2003 |
| JP | 2004286523 A | 10/2004 |
| JP | 2010181368 A | 8/2010 |
| JP | 2010193670 A | 9/2010 |
| JP | 2010239845 A | 10/2010 |
| JP | 2011125186 A | 6/2011 |
| JP | 2011203187 A | 10/2011 |
| JP | 5104803 B | 12/2012 |
| WO | 2010113904 A1 | 10/2010 |

OTHER PUBLICATIONS

ISA Japanese Patent Office, International Search Report of PCT/JP2011/007278, Apr. 3, 2012, WIPO, 1 page.

* cited by examiner

GROUND LEAKAGE DETECTOR, AND METHOD OF DETECTING GROUND LEAKAGE IN ELECTRIC VEHICLE

TECHNICAL FIELD

The present invention relates to a ground leakage detector, and a method of detecting a ground leakage in an electric vehicle.

BACKGROUND ART

A vehicle (hereinafter will be referred to as electric vehicle) which uses electric energy as a driving power source incorporates electric components such as a battery storing DC power, an inverter which converts the DC power stored in the battery into AC power, and an electric motor activated by the AC power output from the inverter. These electric components are accommodated in a case having an insulativity to be isolated (floating) from a vehicle body ground location maintained at a ground potential. For example, Patent Literature 1 discloses that a ground leakage is detected and a ground leakage location is estimated even in a state in which the battery is isolated from the vehicle body ground location.

CITATION LIST

Patent Literature

Patent Literature 1: Japanese-Laid Open Patent Application Publication No. Hei. 6-153303

SUMMARY OF INVENTION

Technical Problem

The ground leakage detector disclosed in Patent Literature 1 detects a ground leakage after systems (e.g., power supply system, measuring system, and control system) in the electric vehicle are activated. That is, the ground leakage detector disclosed in Patent Literature 1 is unable to detect a ground leakage before the systems in the electric vehicle are activated.

The present invention has been developed to solve the above described problem, and an object of the present invention is to provide a device and method which can easily detect a ground leakage regardless of whether or not a system in an electric vehicle is activated.

Solution to Problem

To solve the above described problem, according to an aspect of the present invention, there is provided a ground leakage detector for detecting a ground leakage in an electric vehicle including a battery, and a charging connector which is electrically connectable to a terminal member formed at one end of an outside electric wire through which electric power is supplied from outside to the battery, the ground leakage detector comprising: a connector connection section electrically connectable to the charging connector; a contactor configured to contact a vehicle body ground location in the electric vehicle; and a detecting circuit for detecting whether or not there is a ground leakage from the battery to the vehicle body ground location, based on a current flowing between the connector connection section and the contactor.

In accordance with this configuration, since the connector connection section of the ground leakage detector is electrically connected to the charging connector of the electric vehicle, the connector connection section can be placed at the electric potential corresponding to the terminal voltage of the battery of the electric vehicle. In other words, there is no need for the operation for sensing the terminal voltage of the battery in a state in which a dedicated connection terminal (e.g., alligator clip) is connected to both ends of the battery, to detect a ground leakage. In this state, by bringing the contactor into contact with the vehicle body ground location, it can be detected whether or not there is a ground leakage from the battery unit to the vehicle body ground location based on the current flowing between the connector connection section and the contactor. In brief, the ground leakage detector which is provided outside the electric vehicle and electrically connected to the charging connector detects a ground leakage. The ground leakage detector can detect whether or not there is a ground leakage, irrespective of whether or not the system in the electric vehicle is activated. Through the above described procedure, even before the system in the electric vehicle is activated, it can be detected whether or not there is a ground leakage in the battery, outside the electric vehicle.

In the above ground leakage detector, the connector connection section may be electrically connectable to a positive side and a negative side of the battery via the charging connector.

In accordance with this configuration, since the connector connection section is electrically connected to the charging connector, a ground leakage in both of the positive side and the negative side of the battery can be detected by switching a circuit.

In the above ground leakage detector, the detecting circuit may include: a switch for performing switching between a state in which one of electrodes of the battery and the vehicle body ground location are shorted via the contactor and a state in which one of electrodes of the battery and the vehicle body ground location are not shorted via the contactor; and an operation determiner section for determining whether or not the detecting circuit is operating correctly when one of electrodes of the battery and the vehicle body ground location are shorted by the switch.

In accordance with this configuration, the normal ground leakage detecting operation or the operation for determining whether or not the detecting circuit is operating correctly, i.e., the self-diagnostic operation, can be selected by using the switch as desired. This makes it possible to carry out the normal ground leakage detecting operation once it is determined that the detecting circuit is operating correctly.

In the above ground leakage detector, the electric vehicle may include: a first in-vehicle relay which is placed between the charging connector and the battery and connects the charging connector and the battery to each other or disconnects the charging connector and the battery from each other; and a vehicle body control unit for activating the first in-vehicle relay; and the charging connector and the connector connection section may be configured such that the ground leakage detector and the vehicle body control unit are mutually communicable; and the ground leakage detector may be configured to output to the vehicle body control unit a command for activating the first in-vehicle relay to connect the charging connector and the battery to each other, via the connector connection section and the charging connector, when the detecting circuit is activated.

In accordance with this configuration, the ground leakage detecting operation is not performed as soon as the connector connection section is electrically connected to the charging connector, but the first in-vehicle relay is activated to connect the charging connector and the battery to each other only when the ground leakage detecting operation is performed. Therefore, it becomes possible to perform the ground leakage detecting operation using the electric power stored in the battery.

In the ground leakage detector, the electric vehicle may include: a second in-vehicle relay which is electrically connected to a system operation power supply and closes a contact of the second in-vehicle relay before a system is activated; the ground leakage detector may be configured to output to the vehicle body control unit a command for activating the second in-vehicle relay to close the contact of the second in-vehicle relay, via the connector connection section and the charging connector, when the detecting circuit is activated.

In accordance with this configuration, after connection of the connector is established, the commands for closing the contacts of the first and second in-vehicle relays can be provided, and a circuit for detecting a ground leakage can be configured even before the system is activated. Thus, the ground leakage detecting operation can be performed even before the system is activated.

In the ground leakage detector, the detecting circuit may be configured to output to the vehicle body control unit a command for activating the first in-vehicle relay to disconnect the charging connector and the battery from each other, via the connector connection section and the charging connector, when a predetermined termination condition is satisfied.

In accordance with this configuration, when the predetermined termination condition, for example, a time that passes from the ground leakage detecting operation is initiated reaches a predetermined threshold time, the first in-vehicle relay is activated to disconnect the charging connector and the battery from each other. Therefore, it becomes possible to prevent a ground leakage detection state from continuing undesirably, and lessen consumption of the electric power stored in the battery. The predetermined termination condition may be such that the time that passes from when the ground leakage detecting operation is initiated reaches the predetermined threshold time or another condition. For example, the predetermined termination condition may be such that the ground leakage detecting operation for the positive side and the negative side is terminated or a ground leakage at the positive side or the negative side is detected.

In the ground leakage detector, the detecting circuit may further include: a voltage source which is connected to the connector connection section in parallel with the battery and has a voltage lower than a terminal voltage of the battery; and wherein when the operation determiner section may determine whether or not the detecting circuit is operating correctly, the detecting circuit may be electrically disconnected from the battery via the charging connector and the connector connection section and cause one of electrodes of the voltage source and the vehicle body ground location to be shorted via the contactor.

In accordance with this configuration, in the self-diagnostic process, by utilizing the voltage of the voltage source (voltage derived by AC/DC converting a voltage of built-in battery or power supply utility, etc.) of the ground leakage detector which is lower than the terminal voltage of the battery of the electric vehicle, rather than the terminal voltage of the battery, consumption of the electric power stored in the battery can be lessened. Since the voltage of the voltage source of the ground leakage detector is lower than the terminal voltage of the battery of the electric vehicle, it becomes possible to lessen a current flowing when one of the electrodes of the voltage source and the vehicle body ground location are shorted via the contactor in the self-diagnostic process. Thus, safety of the ground leakage detector can be improved. Furthermore, a ground leakage can be detected even though the SOC of the battery is less.

The ground leakage detector may be mounted in an outside charger electrically connectable to the charging connector.

In accordance with this configuration, the connector of the outside charger which is electrically connectable to the charging connector can be efficiently utilized. Therefore, it is not necessary to provide another connector intended for the ground leakage detector mounted in the outside charger.

The ground leakage detector may automatically detect whether or not there is a ground leakage when charging is initiated or terminated.

In accordance with this configuration, it becomes possible to automatically confirm whether or not the charging will be or has been performed correctly, when the outside charger initiates or terminates the charging of the battery.

The ground leakage detector may regularly detect whether or not there is a ground leakage in a state in which the outside charger is electrically connected to the charging connector for a long period of time.

In accordance with this configuration, it becomes possible to detect whether or not there is a ground leakage by efficiently utilizing the long period of time for which the electric vehicle electrically connected to the charging connector is in storage.

To solve the above described problem, according to another aspect of the present invention, there is provided a method of detecting a ground leakage in an electric vehicle including a battery, and a charging connector which is electrically connectable to a terminal member formed at one end of an outside electric wire through which electric power is supplied from outside to the battery, by using a ground leakage detector including a connector connection section electrically connectable to the charging connector and a contactor configured to contact a vehicle body ground location in the electric vehicle, the method comprising: electrically connecting the connector connection section to the charging connector; bringing the contactor into contact with the vehicle body ground location; and detecting whether or not there is a ground leakage from the battery to the vehicle body ground location, based on a current flowing between the connector connection section and the contactor.

In accordance with this method, detection of a ground leakage in the battery can be easily performed outside the electric vehicle, even before the system in the electric vehicle is activated.

To solve the above described problem, according to another aspect of the present invention, there is provided a method of detecting a ground leakage in an electric vehicle including a battery, an in-vehicle ground leakage detector for detecting a ground leakage from the battery to a vehicle body ground location maintained at a ground potential, and a charging connector which is electrically connectable to a terminal member formed at one end of an outside electric wire through which electric power is supplied from outside to the battery and communicable with the in-vehicle ground leakage detector, by using a control device including a connector connection section which is electrically connectable to the charging connector and communicable with the in-vehicle ground leakage detector, the method comprising: electrically connecting the connector connection section to the charging connector; transmitting an activation command from the control device to the in-vehicle ground leakage detector via the connector connection section and the charging connector; receiving by the in-vehicle ground leakage detector the activation command from the control device and detecting by the in-vehicle ground leakage detector whether or not there is a ground leakage from the battery to the vehicle body ground location; transmitting information indicative of a result of detection as to whether or not there is a ground leakage from the in-vehicle ground leakage detector to the control device via the charging connector and the connector connection section; and receiving by the control device the information indicative of the result of detection as to whether or not there is a ground leakage from the in-vehicle ground leakage detector via the charging connector and the connector connection section.

In accordance with this method, detection of a ground leakage in the battery can be easily performed outside the electric vehicle, even before the system in the electric vehicle is activated.

The above and further objects, features and advantages of the invention will more fully be apparent from the following detailed description of a preferred embodiment with reference to the accompanying drawings.

Advantageous Effects of Invention

In accordance with the present invention, it is possible to provide a device and method which can easily detect a ground leakage irrespective of whether or not a system in an electric vehicle is activated.

DESCRIPTION OF EMBODIMENTS

Figure 1:
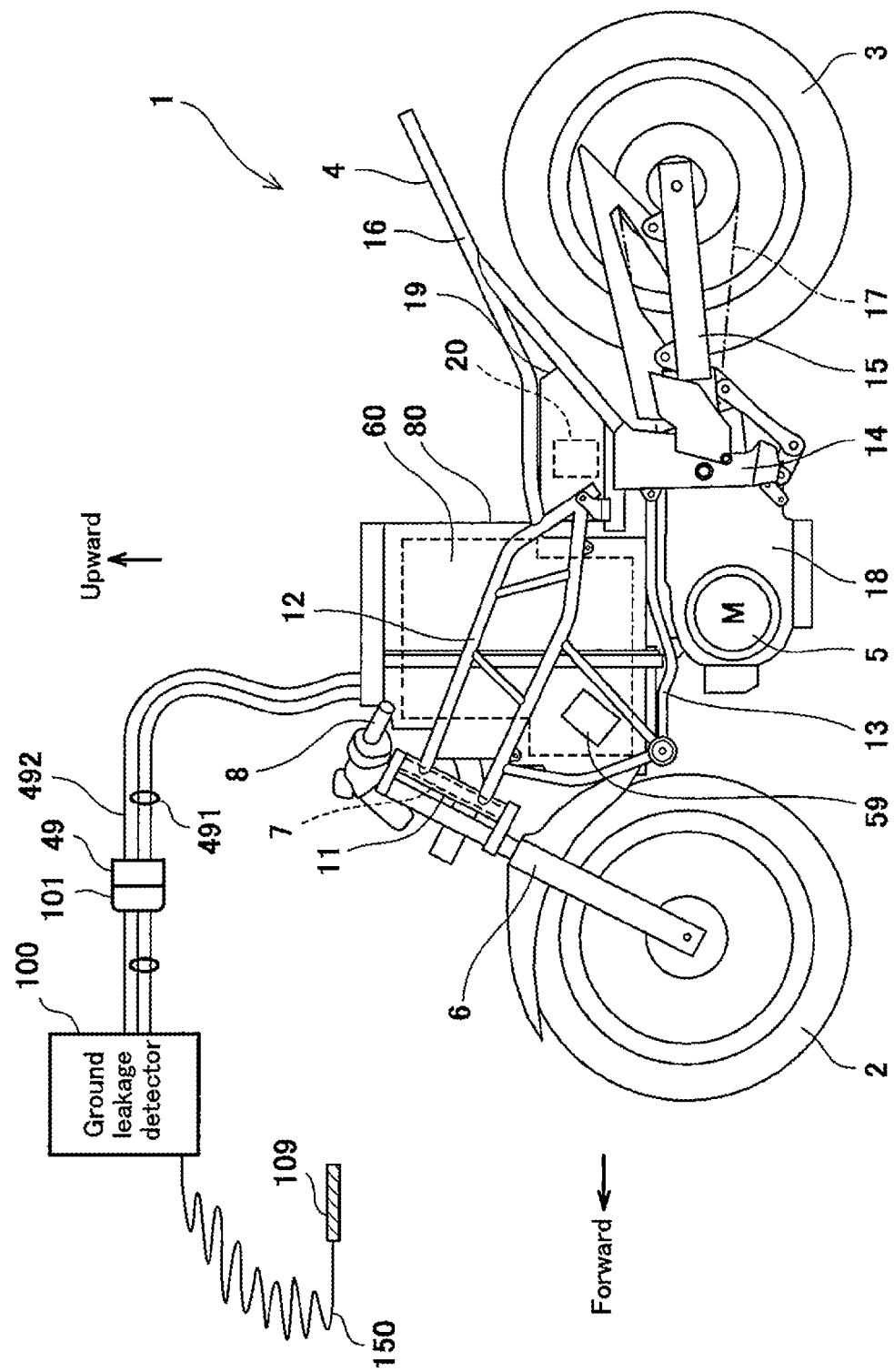
FIG. 1 is a view showing an example of a left side view of an electric vehicle and an example of an outside connection of the electric vehicle, as an exemplary configuration of an overall system according to Embodiment 1 of the present invention.

Hereinafter, embodiments of the present invention will be described with reference to the drawings. Hereinafter, throughout the drawings, the same or corresponding components are designated by the same reference numerals, and will not be described repeatedly, unless otherwise noted.

Embodiment 1

Exemplary Configuration of Overall System

In Embodiment 1 of the present invention, a charging connector used for charging a battery, which is equipped in an electric vehicle, is utilized as a connector for electrically and communicatively connecting a ground leakage detector outside the electric vehicle and the electric vehicle to each other, and a ground leakage in the electric vehicle can be detected even before a system in the electric vehicle is activated.

FIG. 1 is a view showing an example of a left side view of an electric vehicle and an example of an outside connection of the electric vehicle, as an exemplary configuration of an overall system according to Embodiment 1 of the present invention. Although an electric motorcycle is exemplarily shown as the electric vehicle in FIG. 1, the electric vehicle is not limited to the electric motorcycle, but may be another straddle electric vehicle (electric three-wheeled vehicle or the like), an electric four-wheeled vehicle having a living space such as a multi-purpose vehicle, or an electric vehicle other than the vehicle, such as a small boat. Or, the electric vehicle may be a hybrid electric vehicle, incorporating an internal combustion engine in addition to an electric motor.

As shown in FIG. 1, the electric motorcycle 1 includes a front wheel 2 which is a driven wheel, a rear wheel 3 which is a drive wheel, a vehicle body frame 4 which is disposed between the front wheel 2 and the rear wheel 3, and an electric motor 5 mounted to the vehicle body frame 4. The electric motorcycle 1 is not equipped with an internal combustion engine and is configured to rotate the rear wheel 3 by driving power generated in the electric motor 5.

The front wheel 2 is rotatably mounted to the lower portion of a front fork 6 extending substantially vertically such that it is inclined at a certain caster angle. A steering shaft 7 is coupled to the upper portion of the front fork 6, and a bar-type handle 8 is attached to the upper portion of the steering shaft 7. A right grip of the handle 8 is a throttle grip which is operated by the rider to adjust the driving power generated in the electric motor 5.

The vehicle body frame 4 includes a head pipe 11, a pair of right and left and a pair of upper and lower main frames 12, a pair of right and left down frames 13, a pair of right and left pivot frames 14, a pair of right and left swing arms 15, and a seat frame 16. The head pipe 11 supports the steering shaft 7 such that the steering shaft 7 is rotatable.

The seat frame 16 supports a seat (not shown) on which the rider and a passenger are seated in a forward or rearward direction.

The electric motor 5 is placed in a region which is below the down frame 13 and in front of the pivot frame 14. The driving power generated in the electric motor 5 is transmitted to the rear wheel 3 via a driving power transmission mechanism 17. The electric motor 5 is accommodated in a motor case 18 having an insulativity. The motor case 18 accommodates a transmission (not shown) constituting the driving power transmission mechanism 17 together with the electric motor 5, and is suspended from the down frame 13 and the pivot frame 14. The transmission may be a multi-stage transmission or a gearless transmission. Also, the transmission may be a manual transmission or an automatic transmission.

The electric motorcycle 1 incorporates an inverter case 19 having an insulativity and a battery case 80 having an insulativity, in addition to the motor case 18 accommodating the electric motor 5. The inverter case 19 accommodates electric components including an inverter 20. The battery case 80 accommodates the electric components including the battery unit 60. The inverter case 19 is placed in a space of a substantially-inverted triangular space when viewed from a side, which is surrounded by the main frame 12, the pivot frame 14 and the seat frame 16, and positioned just behind the lower rear end portion of the battery case 80. The battery case 80 is placed between the pair of right and left main frames 12, above the lower portions of the pair of right and left down frames 13, and forward relative to the pivot frames 14, and sandwiched between the front wheel 2 and the rear wheel 3 in the forward or rearward direction.

The battery case 80 is provided with a charging connector 49 used for charging a battery unit 60 from outside the electric motorcycle. For example, a fitting (mounting) section of the charging connector 49 may be exposed to the outer surface of the battery case 80, or placed in an opening (charging port) of the battery case 80 and this opening may be covered with a specified cover.

The fitting section of the charging connector 49 includes a pin attached to the end portion of a charging wire 491 extended from the battery unit 60 and a pin attached to the end portion of a communication wire 492 extended from a vehicle body control unit 59 as will be described later. As shown in FIG. 1, the charging connector 49 is electrically connectable to a ground leakage detector 100 which is used when an operator carries out maintenance as well as an outside charger (not shown) for the battery unit 60.

The ground leakage detector 100 detects a ground leakage from the battery unit 60 to a vehicle body ground location such as the vehicle body frame 4 which is maintained at a ground potential. The ground leakage detector 100 also has a function for intentionally shorting the battery unit 60 and the vehicle body ground location such as the vehicle body frame 4 without actually causing a ground leakage in the electric motorcycle 1 for a self-diagnostic process. The ground leakage detector 100 includes a connector 101 having a pin fitted to a pin of the charging connector 49. FIG. 1 shows a state in which the pin of the charging connector 49 and the pin of the connector 101 are fitted to each other and thereby the ground leakage detector 100 and the electric motorcycle 1 are electrically and communicatively connected to each other. The ground leakage detector 100 includes a contactor (probe) 109 for contacting the vehicle body ground location such as the vehicle body frame 4 which is maintained at a ground potential, in the electric motorcycle 1. The contactor 109 is formed in the end portion of a cable 150 extended from the ground leakage detector 100.

[Exemplary Configuration of Electric System]

Figure 2:
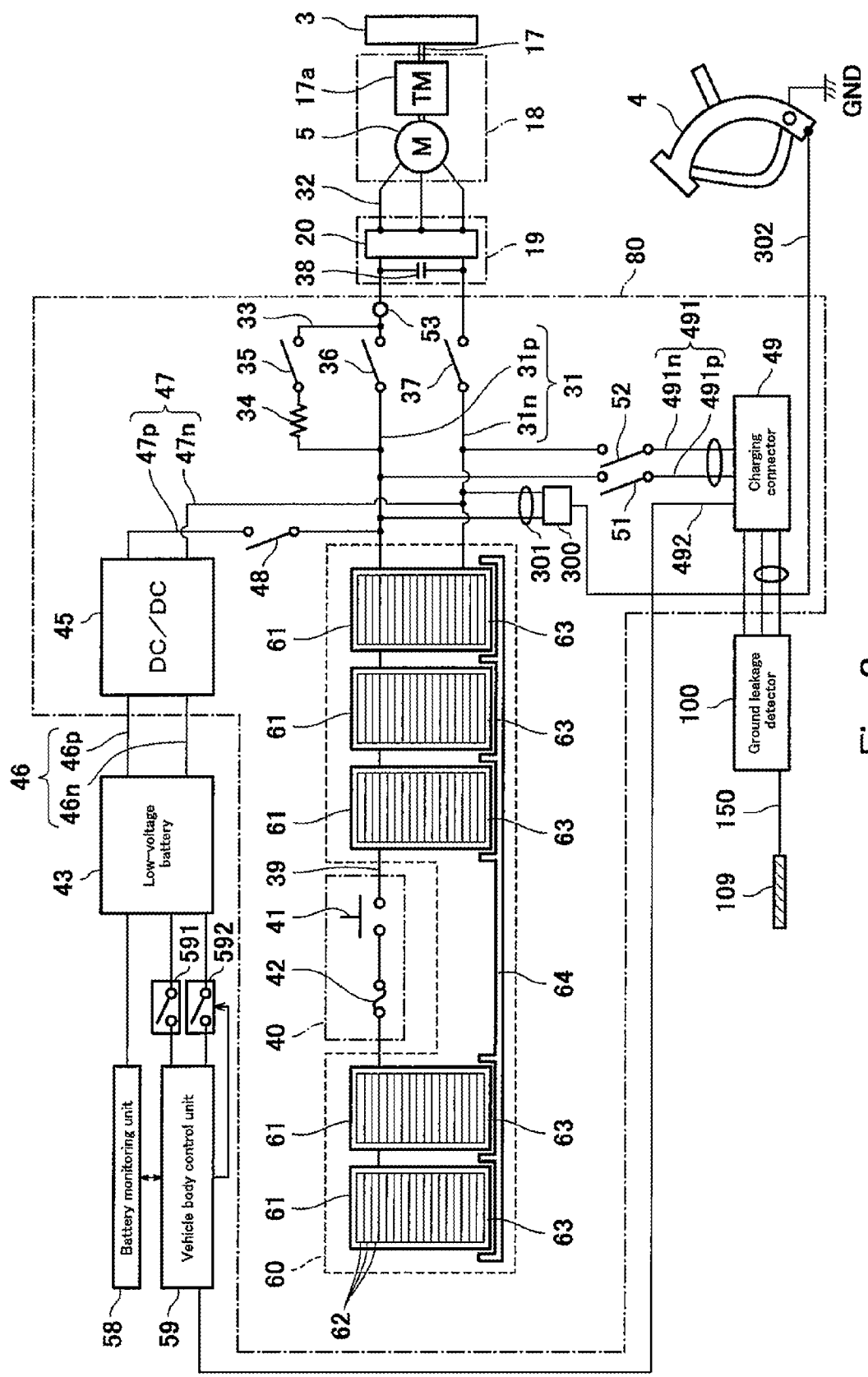
FIG. 2 is a block diagram mainly showing electric components and electric wires thereof, as an exemplary configuration of an electric system in the electric motorcycle of FIG. 1.

FIG. 2 is a block diagram mainly showing electric components and electric wires thereof, as an exemplary configuration of an electric system in the electric motorcycle 1 of FIG. 1.

As shown in FIG. 2, the battery unit 60 includes a plurality of battery modules 61 and a battery frame 64 and is a unit which serves as a high-voltage and DC power single secondary battery. Each of the battery modules 61 includes a plurality of battery cells 62 and a module casing 63 in a rectangular parallelepiped shape, for storing the plurality of battery cells 62. Each of the battery cells 62 is a secondary battery which is capable of storing DC power, and is, for example, a lithium ion battery or nickel metal hydride battery. The plurality of battery cells 62 are aligned and electrically connected to each other in the interior of the module casing 63. The plurality of battery modules 61 are densely arranged in the interior of the battery case 80 and electrically connected in series, in a state in which they are connected to and fastened to the battery frame 64.

As should be understood from the above, the battery unit 60 is configured such that many battery cells 62 are connected in series in an electrical sense, and as a result, serves as the secondary battery of high-voltage DC power (e.g., 200 to 300V). The battery unit 60 is electrically connected to the charging connector 49 via a charging wire 491 composed of a P-side (positive-side) charging wire 491p and an N-side (negative-side) charging wire 491n and electrically and mechanically connected to the inverter 20 via a high-voltage electric wire 31 composed of a P-side power supply wire 31p and an N-side power supply wire 31n. The inverter 20 converts the high-voltage DC power supplied from the battery unit 60 into three-phase AC power in accordance with a torque command or the like from the vehicle body control unit 59, and supplies the three-phase AC power to the electric motor 5 via a three-phase AC wire 32. The electric motor 5 is activated by the AC power supplied from the inverter 20 to generate driving power corresponding to electric characteristics such as a current.

A P-side inverter relay 36 is provided on the P-side power supply wire 31p of the high-voltage electric wire 31. A bypass wire 33 which branches from the P-side power supply wire 31p is provided in parallel with the P-side inverter relay 36. A current restricting resistor 34 and an anti-rush-current relay 35 are arranged in series on the bypass wire 33. An N-side inverter relay 37 is provided on the N-side power supply wire 31n of the high-voltage electric wire 31.

An in-vehicle ground leakage detector 300 is electrically connected to a wire 301 which branches from the high-voltage electric wire 31 in a location between the battery unit 60, and the P-side inverter relay 36 and the N-side inverter relay 37. The in-vehicle ground leakage detector 300 detects a ground leakage from the battery unit 60 to the vehicle body ground location such as the vehicle body frame 4 which is maintained at a ground potential. For example, the in-vehicle ground leakage detector 300 is connected to the vehicle body frame 4 which is maintained at a ground potential via a ground wire 302, in addition to a high-voltage wire 301 which branches from the high-voltage electric wire 31 at a location which is between the battery unit 60 and the inverter relays (36, 37). The in-vehicle ground leakage detector 300 is configured such that, for example, two ground leakage detecting resistors are connected in series and the connection points of the ground leakage detecting resistors are connected to the ground potential. The in-vehicle ground leakage detector 300 is configured to detect whether or not a ground leakage path is formed from the battery unit 60 to the vehicle body frame 4 according to voltage drops generated in the ground leakage detecting resistors, respectively. The in-vehicle ground leakage detector 300 may be capable of directly activating the inverter relays (36, 37) to disconnect the battery unit 60 and the inverter 20 from each other when it detects a ground leakage in the battery unit 60, in addition to the detection of a ground leakage in the battery unit 60. Or, the in-vehicle ground leakage detector 300 may transmit to the vehicle body control unit 59 a result of detection of a ground leakage, to cause the vehicle body control unit 59 to activate the inverter relays (36, 37).

The inverter case 19 contains a smoothing capacitor 38, the electrodes of which are connected to the P-side power supply wire 31$p$ and the N-side power supply wire 31$n$. At the activation of the system in the electric motorcycle 1, it becomes possible to prevent a rush current with an excessively great magnitude from flowing through the inverter 20 by suitably selecting OPEN/CLOSE of the relays (35 to 37), even under a state in which charges are not accumulated in the smoothing capacitor 38. Current meter(s) 53 is/are attached onto the P-side power supply wire 31$p$, the N-side power supply wire 31$n$, and/or the bypass wire 33. In FIG. 2, a case where the current meter 53 is attached only on the P-side power supply wire 31$p$ is exemplarily shown.

A service plug 40 is provided on a connection wire 39 connecting the battery modules 61 placed adjacently to each other. The service plug 40 includes a plug 41 for performing switching between continuity (conduction) and cut-off (disconnection) of the connection wire 39 and a fuse 42 for cutting-off (disconnecting) the connection wire 39 if a current with an excessively great magnitude flows therethrough. A maintenance operator operates the plug 41 manually to enable switching between a power supply state in which the connection wire 39 is placed in a conductive state and the electric power can be supplied from the battery unit 60 to the electric motor 5 and a cut-off (disconnection) state in which the connection wire 39 is placed in a cut-off state and the electric power supplied from the battery unit 60 to the electric motor 5 is cut off.

The electric motorcycle 1 includes a low-voltage battery 43 which is a secondary battery of low-voltage DC power (e.g., 12V), separately from the battery unit 60 which is an electric power supply for the electric motor 5. The low-voltage battery 43 is connected to a power load other than the electric motor 5, via a low-voltage electric wire 44. The power load which uses the low-voltage battery 43 as the electric power supply includes, for example, a battery monitoring unit 58 for monitoring the SOC (state of charge) of the battery unit 60, and a vehicle body control unit 59 for controlling the overall electric motorcycle 1, including control for activating the electric motor 5 and the inverter 20. Note that the battery monitoring unit 58 is able to activate the relays (35 to 37) so that the high-voltage electric wire 31 between the battery unit 60 and the inverter 20 is disconnected according to the SOC of the battery unit 60. The vehicle body control unit 59 mutually communicates with the battery monitoring unit 58 and shares the information indicative of the SOC of the battery unit 60 with the battery monitoring unit 58. The vehicle body control unit 59 activates the relays (35 to 37) based on the information indicative of the SOC of the battery unit 60 or outputs a desired torque command to the inverter 20. In addition, the power load which uses the low-voltage battery 43 as the electric power supply includes a lighting device such as a head light, a tail lamp, and a direction indicator, instruments (gauges) such as a speed indicator, and a display unit.

The low-voltage battery 43 is connected to a DC/DC converter 45 via a low-voltage converter wire 46 composed of a P-side power supply wire 46$p$ a and an N-side power supply wire 46$n$. The DC/DC converter 45 is connected to the P-side power supply wire 31$p$ and the N-side power supply wire 31$n$ of the high-voltage electric wire 31 via a high-voltage converter wire 47 composed of a P-side power supply wire 4'7$p$ and an N-side power supply wire 47$n$. A DC/DC converter relay 48 is provided on a P-side power supply wire 4'7$p$ and an N-side power supply wire 47$n$ of the high-voltage converter wire 47. In FIG. 2, a case where the DC/DC converter relay 48 is provided only on the high-voltage power supply wire 4'7$p$ is exemplarily shown.

The high-voltage electric wire 31 is connected to the charging connector 49 via the charging wire 491 composed of the P-side charging wire 491$p$ and the N-side charging wire 491$n$. A P-side charging relay 51 is provided on the P-side charging wire 491$p$, while an N-side charging relay 52 is provided on the N-side charging wire 491$n$. As described above, the charging connector 49 includes pins formed at the end portion of the P-side charging wire 491$p$ and at the end portion of the N-side charging wire 491$n$, and the pin formed at the end portion of the communication wire 492 for use in communication between the vehicle body control unit 59 and the ground leakage detector 100. The charging connector 49 is a connector electrically connected to an outside charger for charging the battery unit 60 and electrically connected to the connector 101 of the ground leakage detector 100. In brief, the charging connector 49 is used as the connector electrically connecting the ground leakage detector 100 to the electric motorcycle 1.

In a state in which the outside charger is electrically connected to the charging connector 49, the electric power is supplied from the outside charger to the battery unit 60 via the charging wire 491 and the high-voltage electric wire 31 and charged into the battery unit 60. The electric power supplied from the outside charger can also be charged into the low-voltage battery 43. Further, during deceleration of the electric motorcycle 1, the electric motor 5 operates as an electric generator. In this case, the inverter 20 converts the AC power (regenerative electric power) generated by the electric motor 5 into DC power which can be charged into the battery unit 60 and the low-voltage battery 43. Or, the DC/DC converter 45 converts the DC power stored in the battery unit 60 into DC power for the low-voltage battery 43, and this DC power can be charged into the low-voltage battery 43.

[Exemplary Configuration of Ground Leakage Detector]

Figure 3A:
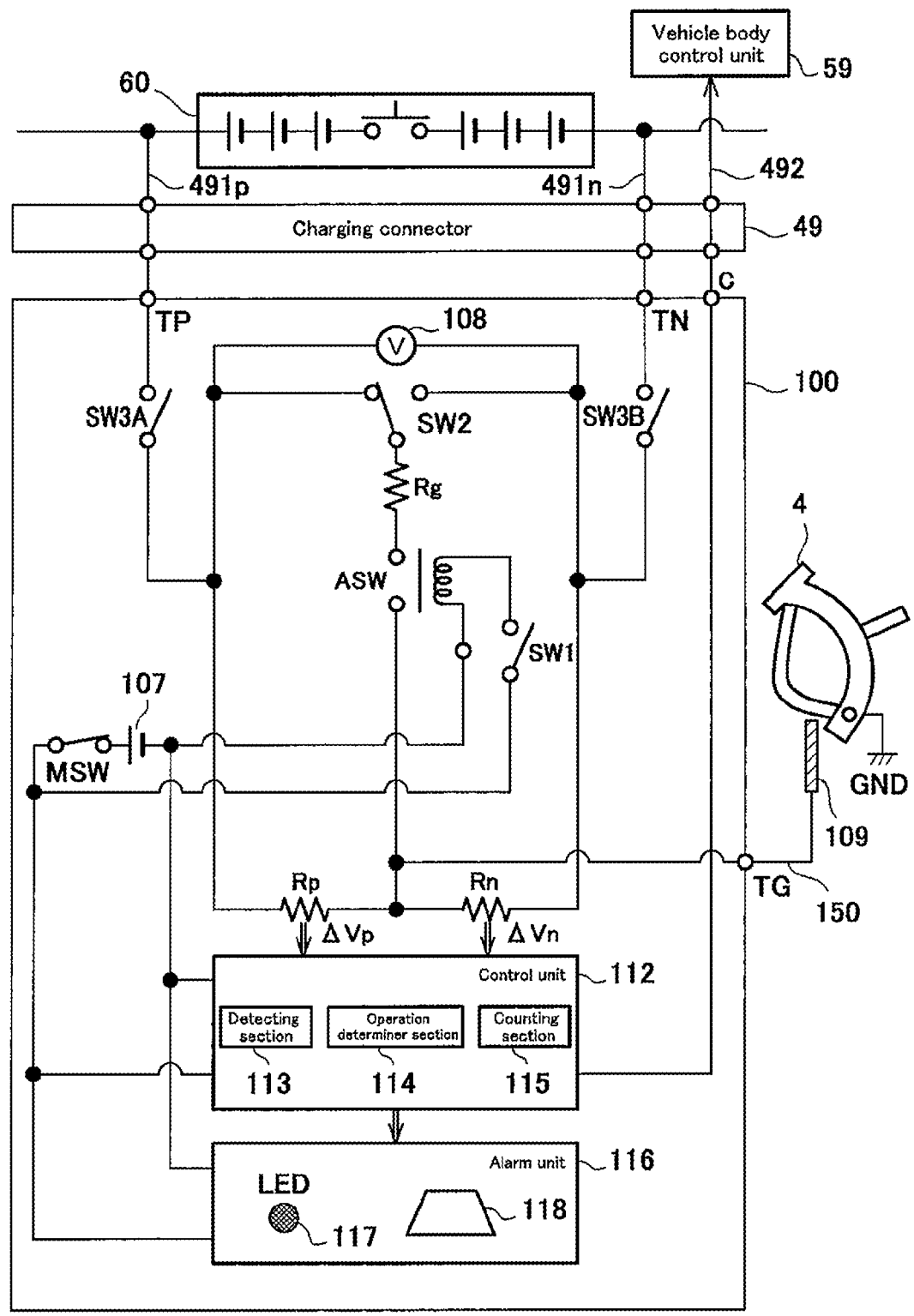
FIG. 3A is a view showing an exemplary circuit configuration of a ground leakage detector of FIG. 1.
Figure 3B:
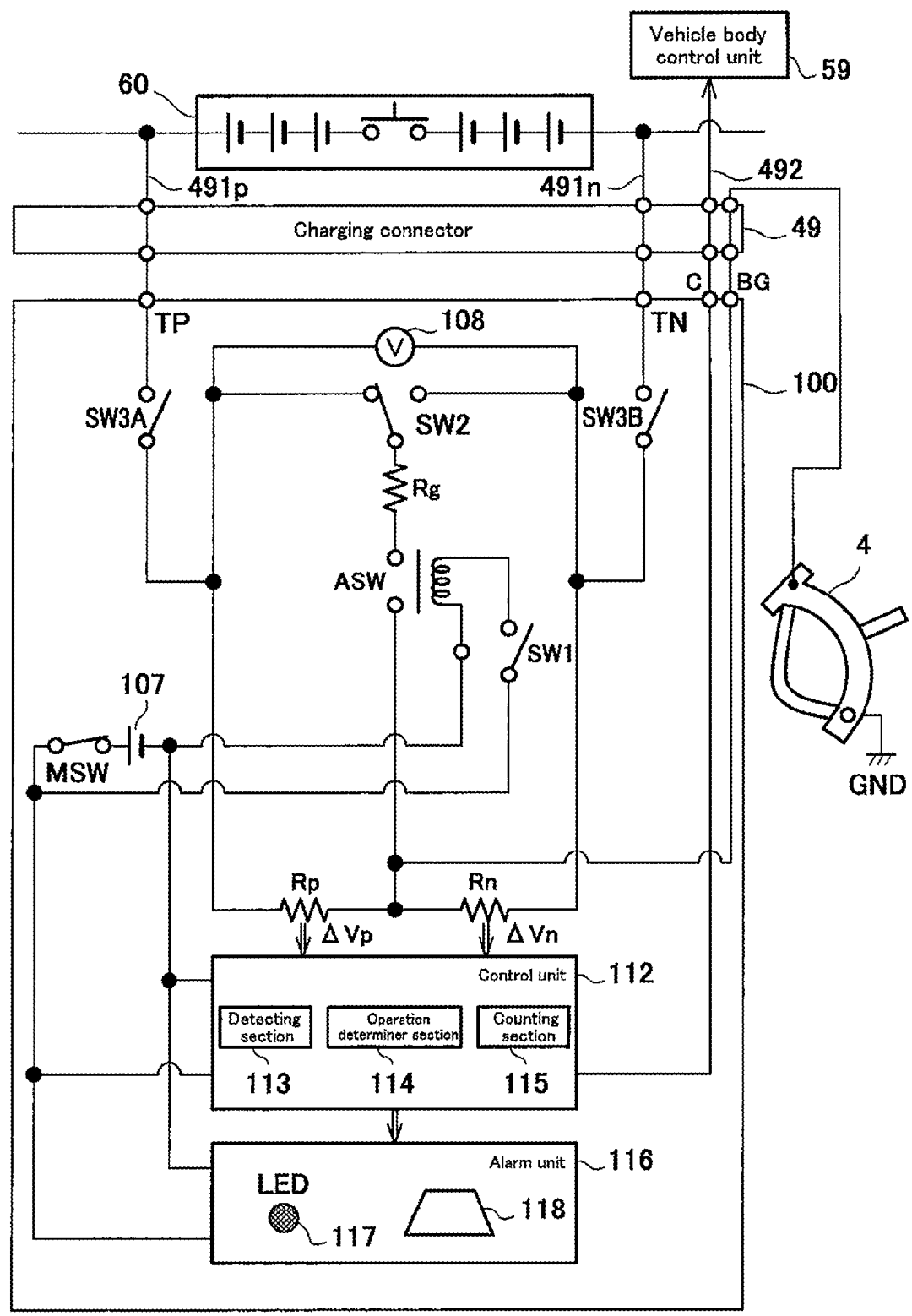
FIG. 3B is a view showing another exemplary circuit configuration of the ground leakage detector of FIG. 1.

FIGS. 3A and 3B are views showing an exemplary circuit configuration of the ground leakage detector 100 of FIG. 1. FIGS. 3A and 3B show a case where the connector 101 electrically connected to the charging connector 49 is integrated with the ground leakage detector 100, for the sake of simplified illustration.

The ground leakage detector 100 is a portable (mobile) ground leakage detector which can be carried by a maintenance operator. The ground leakage detector 100 of FIG. 3A includes a P-side connector terminal TP connected to the pin of the charging connector 49 which is the end portion of the P-side charging wire 491$p$ extended from the P-side of the battery unit 60, an N-side connector terminal TN connected to the pin of the charging connector 49 which is the end portion of the N-side charging wire 491*n* extended from the N-side of the battery unit 60, a control terminal C connected to the pin of the charging connector 49 which is the end portion of the communication wire 492 extended from the vehicle body control unit 59, and a contactor connection terminal TG connected to one end of the cable 150 extended from the contactor 109. In brief, as the pins of the charging connector 49, there are three pins corresponding to the terminals (TP, TN, C) other than the contactor connection terminal TG.

In contrast, the ground leakage detector 100 of FIG. 3B does not include the contactor 109, unlike the ground leakage detector 100 of FIG. 3A. This ground leakage detector 100 of FIG. 3B is electrically connectable to the vehicle body ground location such as the vehicle body frame 4 via the charging connector 49. The ground leakage detector 100 of FIG. 3B is different from the ground leakage detector 100 of FIG. 3A in that a vehicle body ground terminal BG is provided instead of the contactor connection terminal TG. Therefore, the ground leakage detector 100 of FIG. 3B includes four pins corresponding to the terminals (TP, TN, C) other than the contactor connection terminal TG and the vehicle body ground terminal BG respectively, as the pins of the charging connector 49. The ground leakage detector 100 of FIG. 3A and the ground leakage detector 100 of FIG. 3B may further include a ground terminal G which determines the ground potential inside the detector so that it is equal to the ground potential of the vehicle body. In this case, the ground leakage detector 100 of FIG. 3A includes four pins (pins corresponding to terminals TP, TN, C, G) and the ground leakage detector 100 of FIG. 3B includes five pins (pins corresponding to terminals TP, TN, C, G, BG), as the pins of the charging connector 49.

The ground leakage detector 100 is configured such that ground leakage detecting resistors Rp, Rn are connected in series between the P-side connector terminal TP and the N-side connector terminal TN. An SPST (single pole, single throw) switch SW3A is provided on a wire between the P-side connector terminal TP and the ground leakage detecting resistor Rp, while an SPST switch SW3B is provided on a wire between the N-side connector terminal TN and the ground leakage detecting resistor Rn. The P-side connector terminal TP and N-side connector terminal TN, and the switch SW3A and the switch SW3B implement the connector connection section configured to be electrically connectable to the P-side and N-side of the battery unit 60 via the charging connector 49. The connection point of the ground leakage detecting resistors Rp, Rn is connected to the contactor connection terminal TG. Therefore, when the contactor 109 contacts the vehicle body frame 4 maintained at the ground potential, the electric potential of the connection point of the ground leakage detecting resistors Rp, Rn becomes the ground potential of the vehicle body frame 4.

The ground leakage detector 100 is configured such that a built-in battery 107, an SPST switch MSW, an SPST switch SW1, and the coil of an auxiliary relay ASW are connected in series. One end of the resistor Rg is connected to one end of the contact (contact point) of the auxiliary relay ASW, while the other end of the contact (contact point) of the auxiliary relay ASW is connected to the contactor connection terminal TG. The other end of the resistor Rg is connected to a fixed contact (contact point) of an SPDT (single pole, double throw) switch SW2. One of movable contacts (contact points) of the switch SW2 is connected to the P-side connector terminal TP, while the other of the movable contacts of the switch SW2 is connected to the N-side connector terminal TN. A voltage detector 108 for detecting a terminal voltage of the battery unit 60 is connected in parallel with the movable contacts of the switch SW2.

The ground leakage detector 100 includes a control unit 112 and an alarm unit 116 which are activated by the built-in battery 107. The control unit 112 includes a detecting section 113 for detecting whether or not there is a ground leakage from the battery unit 60 to the vehicle body ground location such as the vehicle body frame 4, based on currents (specifically voltage drops ΔVp, ΔVn generated in the ground leakage detecting resistors Rp, Rn) flowing between the connector connection section (TP, TN, SW3A, SW3B) and the contactor 109, an operation determiner section 114 for determining (self-diagnosing) whether or not a ground leakage is detected when the switch SW1 is ON and thereby a short circuit is formed between one of the positive electrode and negative electrode of the battery unit 60 and the vehicle body ground location such as the vehicle body frame 4, via the contactor 109, and a counting section 115 for counting a time that passes from when detection of a ground leakage is initiated. Further, the control unit 112 includes a switch control section (not shown) for controlling the states of the switches (MSW, SW1, SW2, SW3A, SW3B), and a communication processing section (not shown) which performs communication (e.g., CAN [controller area network] communication) with the vehicle body control unit 59 in the electric motorcycle 1 via the control terminal C and the charging connector 49. The control unit 112 is implemented by a CPU (central processing unit), a DSP (digital signal processor), a microcomputer, a logic circuit, etc. The control unit 112 may be configured as a plurality of control units which cooperate with each other to perform distributed control. The alarm unit 116 includes an LED (light-emitting diode) 117 and a speaker 118. When the detecting section 113 of the control unit 112 detects a ground leakage, the LED 117 lights-up, and the speaker 118 outputs an alarm sound indicating that a ground leakage is detected.

[Exemplary Operation of Ground Leakage Detector]

Figure 4:
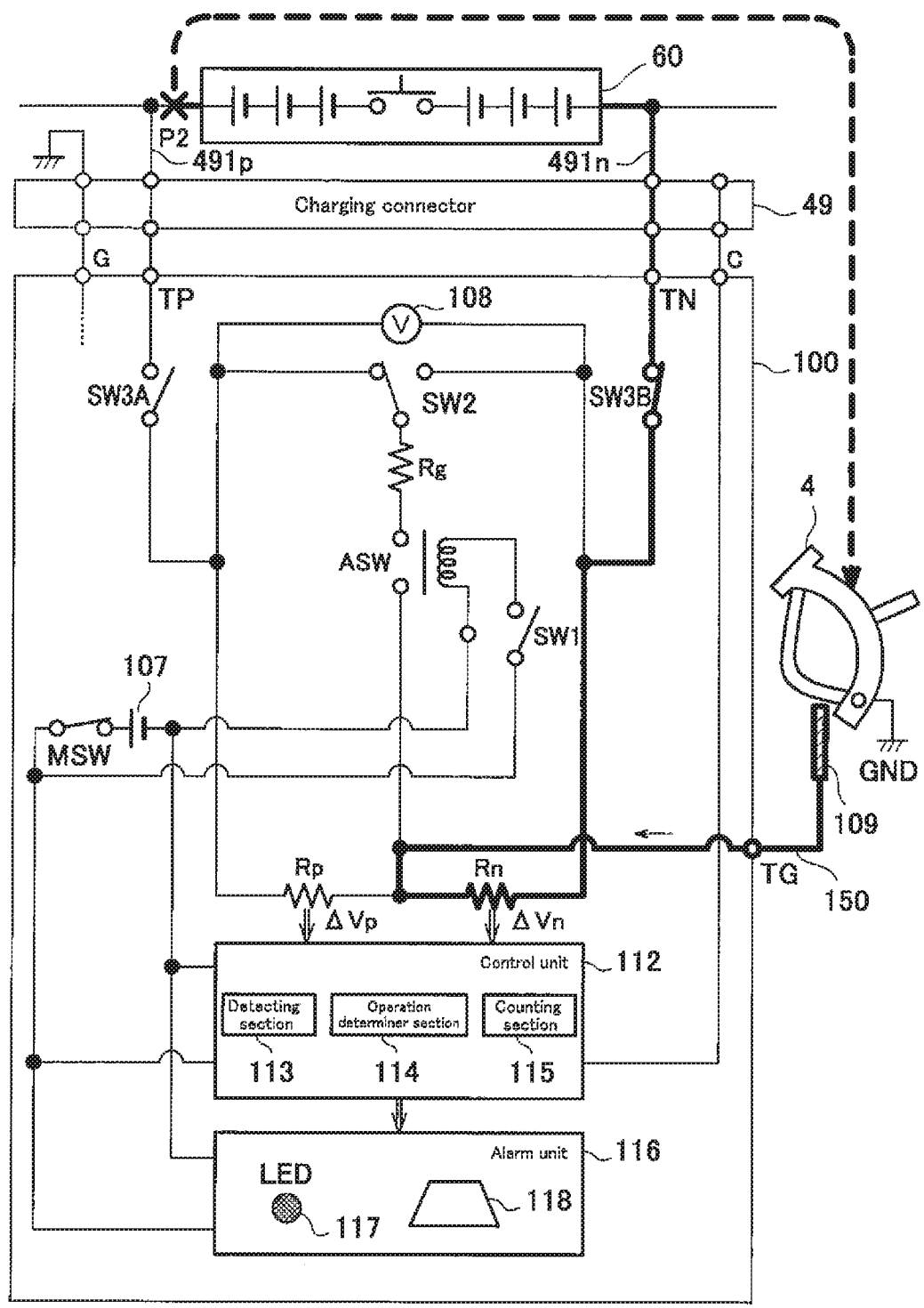
FIG. 4 is a view for explaining an exemplary operation of the ground leakage detector which is performed when a ground leakage occurs in a positive side of a battery unit according to Embodiment 1 of the present invention.
Figure 5:
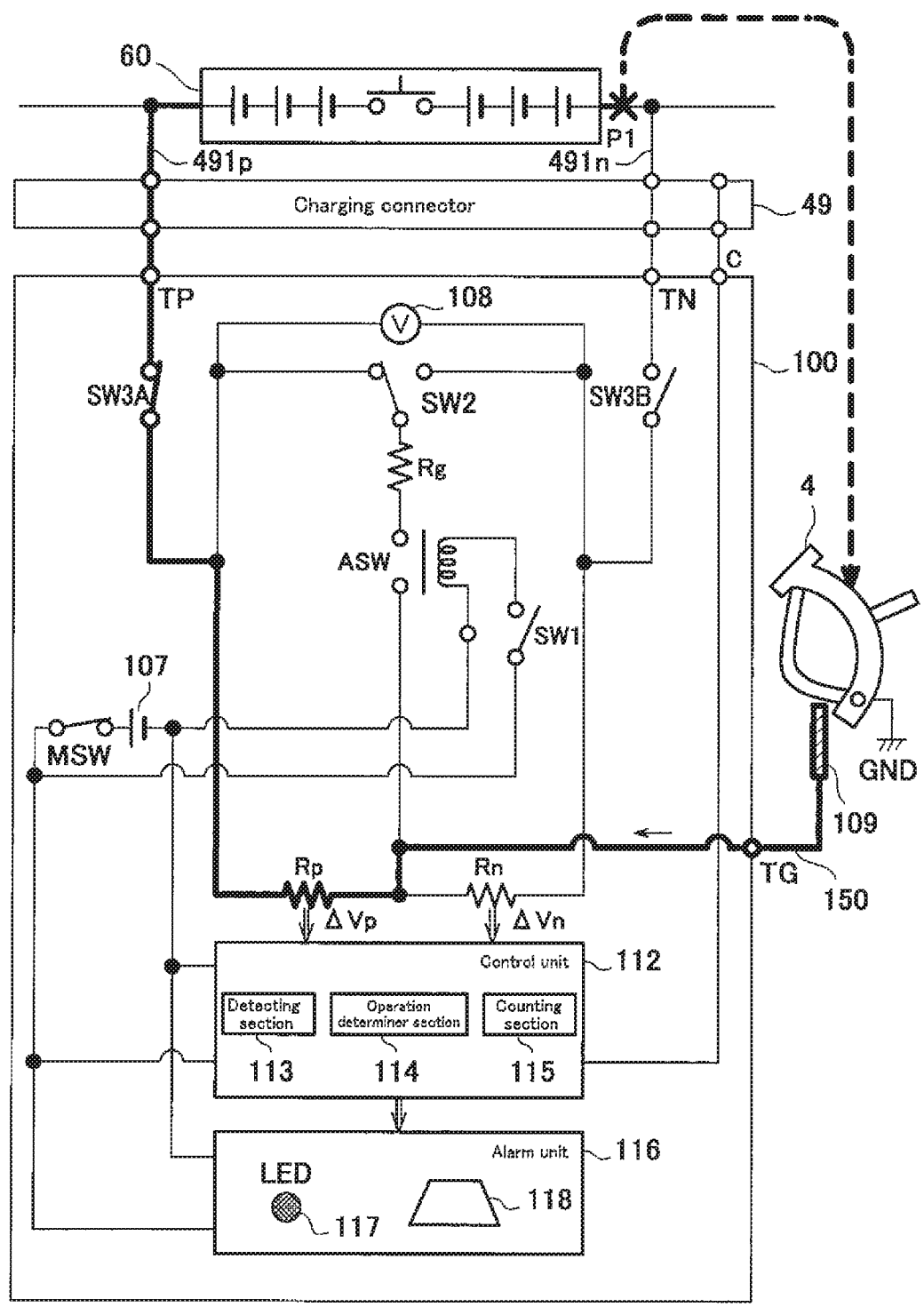
FIG. 5 is a view for explaining an exemplary operation of the ground leakage detector which is performed when a ground leakage occurs in a negative side of the battery unit according to Embodiment 1 of the present invention.

The exemplary operation of the ground leakage detector 100 of FIG. 3A will be described with reference to FIGS. 4 and 5. The exemplary operation of the ground leakage detector 100 of FIG. 3B is different from the exemplary operation of the ground leakage detector 100 of FIG. 3A only in that the contactor 109 does not contact the vehicle body ground location, and will not be described repeatedly. FIG. 4 is a view for explaining the exemplary operation of the ground leakage detector 100 which is performed when a ground leakage occurs in the positive side (P-side) of the battery unit 60 according to Embodiment 1 of the present invention. FIG. 5 is a view for explaining the exemplary operation of the ground leakage detector 100 which is performed when a ground leakage occurs in the negative side (N-side) of the battery unit 60 according to Embodiment 1 of the present invention. In the examples of FIGS. 4 and 5, it is supposed that in the electric motorcycle 1, the contact of the P-side charging relay 51 and the contact of the N-side charging relay 52 which are between the battery unit 60 and the charging connector 49 are closed, while in the ground leakage detector 100, the connector 101 is electrically connected to the charging connector 49 of the electric motorcycle 1.

It is supposed that both of the switch SW3A and the switch SW3B are closed, the ground leakage detector 100 is electrically connected to the P-side and N-side of the battery unit 60, and there is no ground leakage in the battery unit 60. In this case, the terminal voltage of the battery unit 60 is applied to the P-side connector terminal TP and the N-side connector terminal TN of the ground leakage detector 100. Under this condition, when the contactor 109 is brought into contact with the vehicle body ground location such as the vehicle body frame 4, the contactor connection terminal TG and the connection point of the ground leakage detecting resistors Rp, Rn in the ground leakage detector 100 are maintained at the ground potential. Thereby, in the ground leakage detector 100, a voltage corresponding to an electric potential difference between the electric potential at the P-side of the battery unit 60 and the ground potential is applied to the ground leakage detecting resistor Rp, and a voltage corresponding to an electric potential difference between the electric potential at the N-side of the battery unit 60 and the ground potential is applied to the ground leakage detecting resistor Rn. Hereinafter, this state will be referred to as a "correct state."

FIG. 4 exemplarily shows a state in which a ground leakage (shorting) has actually occurred at the P-side of the battery unit 60. Specifically, there is formed a current path (hereinafter will be referred to as ground leakage path, represented by a dashed line in FIG. 4) through which a ground-fault current flows from the ground-fault point P1 at the P-side of the battery unit 60 toward the vehicle body frame 4 via an impedance to ground (not shown). When the switch SW3B is closed, the ground leakage detector 100 is electrically connected to only the N-side of the battery unit 60 via the charging connector 49. The ground-fault current which has flowed from the ground-fault point P1 toward the vehicle body frame 4 via the ground leakage path, is returned to the ground-fault point P1 via a current path represented by a bold line in FIG. 4. The current path represented by the bold line in FIG. 4 extends sequentially through the contactor 109, the cable 150, the contactor connection terminal TG, the ground leakage detecting resistor Rn, the switch SW3B, the N-side connector terminal TN, and the charging connector 49. This causes a voltage drop ΔVn corresponding to the ground-fault current to be generated between both ends of the ground leakage detecting resistor Rn. The ground leakage detector 100 can detect whether or not there is a ground leakage at the P-side of the battery unit 60, by detecting whether or not the voltage drop ΔVn is generated.

FIG. 5 exemplarily shows a state in which a ground leakage (shorting) has actually occurred at the N-side of the battery unit 60. Specifically, there is formed a ground leakage path (represented by a dashed line in FIG. 5) through which a ground-fault current flows is formed from the ground-fault point P2 at the N-side of the battery unit 60 toward the vehicle body frame 4 via an impedance to ground (not shown). Since the switch SW3A is closed, the ground leakage detector 100 is electrically connected to only the P-side of the battery unit 60 via the charging connector 49. The ground-fault current which has flowed from the ground-fault point P2 toward the vehicle body frame 4 via the ground leakage path is returned to the ground-fault point P2 via a current path represented by a bold line in FIG. 5. The current path represented by the bold line in FIG. 5 extends sequentially through the contactor 109, the cable 150, the contactor connection terminal TG, the ground leakage detecting resistor Rp, the switch SW3A, the P-side connector terminal TP and the charging connector 49. This causes a voltage drop ΔVp corresponding to the ground-fault current to be generated between both ends of the ground leakage detecting resistor Rp. The ground leakage detector 100 can detect whether or not there is a ground leakage at the N-side of the battery unit 60, by detecting whether or not the voltage drop ΔVp is generated.

In accordance with the above described exemplary operation, by electrically connecting the connector connection section (TP, TN, switches SW3A, SW3B) to the charging connector 49 of the electric motorcycle 1, the connector connection section of the ground leakage detector 100 can be placed at the electric potential corresponding to the terminal voltage of the battery unit 60 of the electric motorcycle 1. In other words, there is no need for the operation for sensing the terminal voltage of the battery unit 60 in a state in which a dedicated connection terminal (e.g., alligator clip) is connected to both ends of the battery unit 60 to detect a ground leakage. In this state, by bringing the contactor 109 into contact with the vehicle body ground location such as the vehicle body frame 4, it can be detected whether or not there is a ground leakage from the battery unit 60 to the vehicle body ground location based on the current flowing between the connector connection section and the contactor 109. In brief, the ground leakage detector 100 which is provided outside the electric motorcycle 1 and electrically connected to the charging connector 49 detects a ground leakage. Therefore, it can be detected whether or not there is a ground leakage, irrespective of whether or not the system in the electric motorcycle 1 is activated. Through the above described procedure, even before the system in the electric motorcycle 1 is activated, it can be detected whether or not there is a ground leakage in the battery unit 60, outside the electric motorcycle 1.

In addition, in accordance with the above described exemplary operation, by electrically connecting the connector connection section to the charging connector 49, the connector connection section can be placed at the electric potential at the P-side or the N-side of the battery unit 60. This makes it possible to select detection of a ground leakage at the P-side of the battery unit 60 or the N-side of the battery unit 60, as desired.

In accordance with the ground leakage detector 100 of FIG. 3A, the contactor 109 located at the one end of the cable 150 extended from the contactor connection terminal TG is allowed to contact a desired location of the vehicle body. Therefore, the location of the ground leakage in the vehicle body can be searched in detail.

In accordance with the ground leakage detector 100 of FIG. 3B, the vehicle body ground terminal BG is connected to the vehicle body ground location such as the vehicle body frame 4 via the charging connector 49. This eliminates a need for the operation for bringing the contactor 109 of FIG. 3A into contact with the vehicle body ground location, which is convenient for the maintenance operator.

[Exemplary Self-Diagnostic Operation of Ground Leakage Detector]

An exemplary self-diagnostic operation of the ground leakage detector 100 of FIG. 3A will be described with reference to FIGS. 6 and 7. An exemplary self-diagnostic operation of the ground leakage detector 100 of FIG. 3B will not be described, repeatedly.

Figure 6:
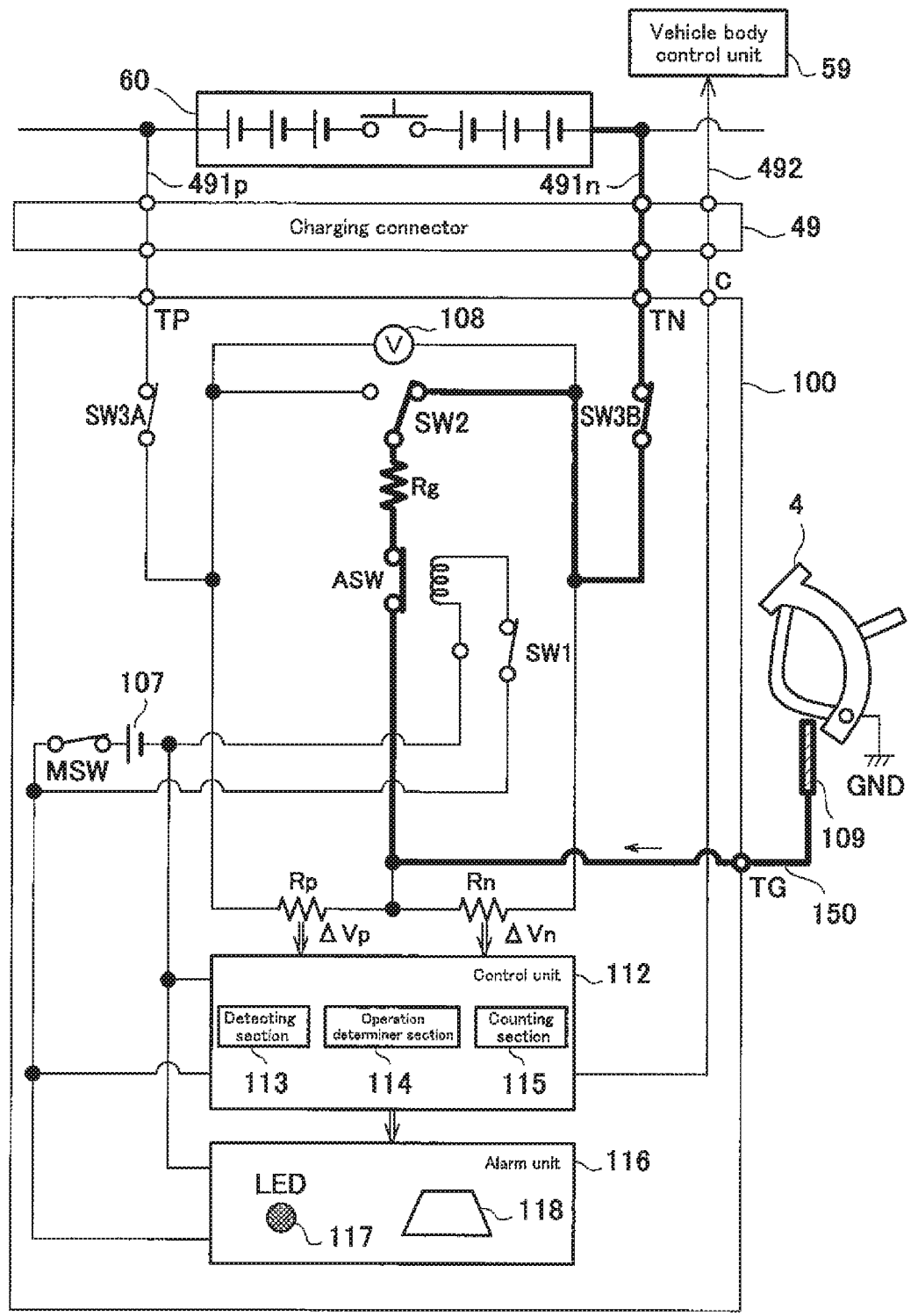
FIG. 6 is a view for explaining a self-diagnostic operation of the ground leakage detector according to Embodiment 1 of the present invention which is performed by simulating an operation for detecting a ground leakage in the negative side of the battery unit.

FIG. 6 is a view for explaining the self-diagnostic operation of the ground leakage detector 100 according to Embodiment 1 of the present invention which is performed by simulating the operation for detecting a ground leakage at the N-side of the battery unit 60. FIG. 7 is a view for explaining the self-diagnostic operation of the ground leakage detector 100 according to Embodiment 1 of the present invention which is performed by simulating the operation for detecting a ground leakage at the P-side of the battery unit 60. In the examples of FIGS. 6 and 7, it is supposed that in the electric motorcycle 1, the contact of the P-side charging relay 51 and the contact of the N-side charging relay 52 which are between the battery unit 60 and the charging connector 49 are closed, while in the ground leakage detector 100, the connector 101 is electrically connected to the charging connector 49 of the electric motorcycle 1.

In the example of FIG. 6, the ground leakage path (represented by the dashed line in FIG. 5) at the N-side of the battery unit 60 is simulated. Specifically, the switch MSW and the switch SW1 are closed. As a result, the coil of the auxiliary relay ASW is excited by the built-in battery 107, and the contact of the auxiliary relay ASW is closed. The connection state of the switch SW2 is established such that the fixed contact of the switch SW2 is connected to one of the movable contacts of the switch SW2 which is connected to the N-side connector terminal TN. The switch SW3B is closed such that the ground leakage detector 100 is electrically connected to the N-side of the battery unit 60.

Thereby, there is formed a current path (represented by a bold line in FIG. 6) from the N-side of the battery unit 60 via the charging connector 49, the N-side connector terminal TN, the switch SW3B, the switch SW2, the resistor Rg, the contact of auxiliary relay ASW, and the contactor connection terminal TG. This current path simulates the ground leakage path (represented by the dashed line in FIG. 5) at the N-side of the battery unit 60. Also, between the N-side of the battery unit 60 and the vehicle body frame 4 maintained at the ground potential, the resistor Rg and the ground leakage detecting resistor Rn are connected in parallel. As compared to the "correct state" in which the switch SW1 and the auxiliary relay ASW are open, impedance values between the both ends of the battery unit 60 and the vehicle body frame 4 are different. For this reason, currents which are different from those in the "correct state" flow through the ground leakage detecting resistors Rp, Rn, respectively. Accordingly, by confirming the activated state of an LED 544 and the activated state of a speaker 545 in the ground leakage detector 100, it can be confirmed whether or not the ground leakage detector 100 is operating correctly.

Figure 7:
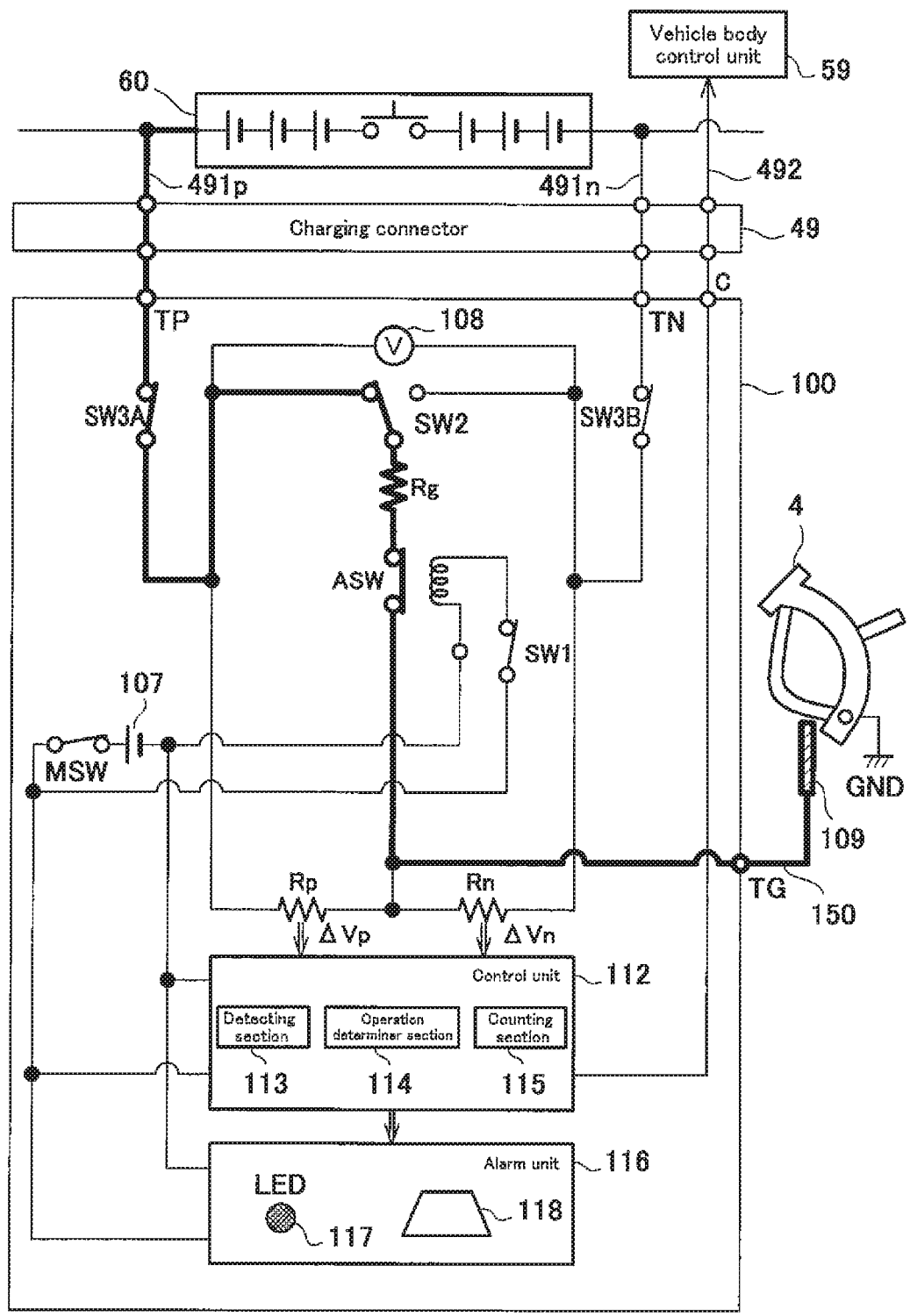
FIG. 7 is a view for explaining a self-diagnostic operation of the ground leakage detector according to Embodiment 1 of the present invention which is performed by simulating an operation for detecting a ground leakage in the positive side of the battery unit.

In the example of FIG. 7, the ground leakage path (represented by the dashed line in FIG. 4) at the P-side of the battery unit 60 is simulated. Specifically, the switch MSW and the switch SW1 are closed. As a result, the coil of the auxiliary relay ASW is excited by the built-in battery 107, and the contact of the auxiliary relay ASW is closed. The connection state of the switch SW2 is established such that the fixed contact of the switch SW2 is connected to the other of the movable contacts of the switch SW2 which is connected to the P-side connector terminal TP. The switch SW3A is closed such that the ground leakage detector 100 is electrically connected to the P-side of the battery unit 60.

Thereby, there is formed a current path (represented by a bold line in FIG. 7) from the P-side of the battery unit 60 via the charging connector 49, the P-side connector terminal TP, the switch SW3A, the switch SW2, the resistor Rg, the contact of the auxiliary relay ASW, and the contactor connection terminal TG. This current path simulates the ground leakage path (represented by the dashed line in FIG. 4) at the P-side of the battery unit 60. Also, between the P-side of the battery unit 60 and the vehicle body frame 4 maintained at the ground potential, the resistor Rg and the ground leakage detecting resistor Rp are connected in parallel. As compared to the "correct state" in which the switch SW1 and the auxiliary relay ASW are opened, impedance values between the both ends of the battery unit 60 and the vehicle body frame 4 are different. For this reason, currents which are different from those in the "correct state" flow through the ground leakage detecting resistors Rp, Rn, respectively. Accordingly, by confirming the activated state of the LED 544 and the activated state of the speaker 545 in the ground leakage detector 100, it can be confirmed whether or not the ground leakage detector 100 is operating correctly.

In accordance with the above described exemplary operation, the normal ground leakage detecting operation or the operation for determining whether or not the ground leakage detector 100 is operating correctly, i.e., the self-diagnostic operation, can be selected by using the switch MSW and the switch SW1 as desired. This makes it possible to carry out the normal ground leakage detecting operation once it is determined that the ground leakage detector 100 is operating correctly. In the self-diagnostic operation, instead of actually causing a ground leakage at the P-side or the N-side of the battery unit 60, one of the electrodes of the battery unit 60 and the vehicle body ground location are shorted intentionally, by using the switch SW1, SW2. This makes it possible to carry out the self-diagnostic operation safely and accurately based on the current flowing between the connector connection section and the contactor 109.

[Exemplary Operation of in-Vehicle Relays in Ground Leakage Detecting Operation/Self-Diagnostic Operation]

In the above described exemplary operation of the ground leakage detector 100, the ground leakage detector 100 may perform the operation for opening and closing the contact of the P-side charging relay 51 and the contact of the N-side charging relay 52 in the electric motorcycle 1, via communication with the vehicle body control unit 59.

Firstly, the connector 101 of the ground leakage detector 100 is electrically connected to the charging connector 49 of the electric motorcycle 1, and thereby the ground leakage detector 100 is communicatively connected to the vehicle body control unit 59 via the connector 101 and the charging connector 49. To initiate the ground leakage detecting operation or the self-diagnostic operation, the ground leakage detector 100 outputs to the vehicle body control unit 59 commands for activating the P-side charging relay 51 and the N-side charging relay 52 to connect the charging connector 49 and the battery unit 60 to each other, via the connector 101 and the charging connector 49. Thereby, the contact of the P-side charging relay 51 and the contact of the N-side charging relay 52 are closed. Then, the ground leakage detector 100 closes one of the switch SW3A and the switch SW3B constituting the connector connection section, and thereby is electrically connected to one of the P-side and the N-side of the battery unit 60. Then, as described above, the ground leakage detector 100 detects whether or not there is a ground leakage from one of the P-side and the N-side of the battery unit 60 to the vehicle body frame 4, or confirms (self-diagnoses) the operation in the detection.

After the ground leakage detector 100 detects whether or not there is a ground leakage, or confirms the operation in the detection, it outputs to the vehicle body control unit 59 commands for activating the P-side charging relay 51 and the N-side charging relay 52 to disconnect the charging connector 49 and the battery unit 60 from each other, via the connector 101 and the charging connector 49. Thereby, the contact of the P-side charging relay 51 and the contact of the N-side charging relay 52 are opened. Therefore, the battery unit 60 and the ground leakage detector 100 are electrically disconnected from each other.

As described above, since the ground leakage detector 100 causes the P-side charging relay 51 and the N-side charging relay 52 in the electric motorcycle 1 to operate, the electric power stored in the battery unit 60 can be efficiently used only over a period for which the ground leakage detector 100 performs the ground leakage detecting operation or the self-diagnostic operation. This makes it possible to lessen consumption of the electric power stored in the battery unit 60.

In the present embodiment, the period for which the ground leakage detector 100 performs the ground leakage detecting operation or the self-diagnostic operation may be, for example, a period before the system in the electric motorcycle 1 is activated. Specifically, at the activation of the system in the electric motorcycle 1, the open/close states of the relays (35 to 37) placed between the battery unit 60 and the inverter 20 are suitably selected to prevent a rush-current from flowing into the inverter 20. Or, in another case, at the activation of the system in the electric motorcycle 1, the DC/DC converter relay 48 placed between the battery unit 60 and the DC/DC converter 45 is opened or closed.

The ground leakage detector 100 outputs to the vehicle body control unit 59 commands for activating the P-side charging relay 51 and the N-side charging relay 52 to connect the charging connector 49 and the battery unit 60 to each other, via the connector 101 and the charging connector 49, in a period before the time of the activation of the system when the contacts of the relays (35 to 37, 48) are opened or closed. This allows the ground leakage detector 100 to perform the ground leakage detecting operation or the self-diagnostic operation in the period before the activation of the system in the electric motorcycle 1.

In addition, in the present embodiment, when a time for which the ground leakage detector 100 performs the ground leakage detecting operation or the self-diagnostic operation passes a predetermined threshold time, supplying of the terminal voltage of the battery unit 60 from the electric motorcycle 1 to the ground leakage detector 100 via the charging connector 49 can be ceased. Specifically, when the time that passes from the initiation of the ground leakage operation, which is counted by the counting section 115, reaches the predetermined threshold time, the ground leakage detector 100 outputs to the vehicle body control unit 59 commands for activating the P-side charging relay 51 and the N-side charging relay 52 to disconnect the charging connector 49 and the battery unit 60 from each other, via the connector 101 and the charging connector 49. This makes it possible to carry out the ground leakage operation using the electric power stored in the battery unit 60.

[Other Exemplary Self-Diagnostic Operation]

Although in the exemplary self-diagnostic operation of the ground leakage detector described with reference to FIGS. 6 and 7, the terminal voltage of the battery unit 60 mounted in the electric motorcycle 1 is utilized, the terminal voltage of the built-in battery 107 mounted in the ground leakage detector 100 may be utilized.

Figure 8:
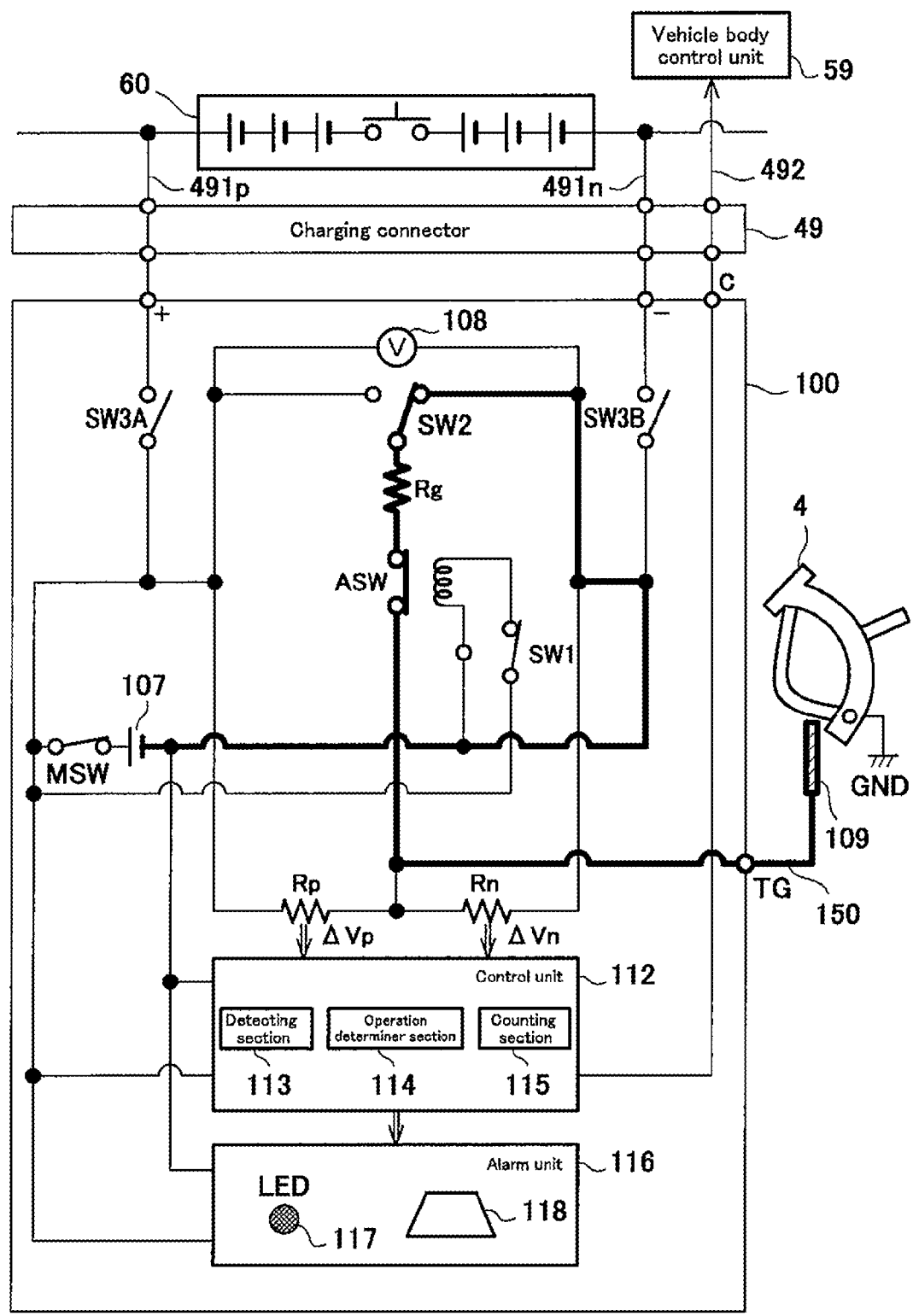
FIG. 8 is a view for explaining a modified example of the self-diagnostic operation of FIG. 6, which utilizes a terminal voltage of a built-in battery mounted in the ground leakage detector.

FIG. 8 is a view for explaining a modified example of the self-diagnostic operation of FIG. 6, which utilizes the terminal voltage of the built-in battery 107 mounted in the ground leakage detector 100.

In the example of FIG. 8, the ground leakage path (represented by the dashed line in FIG. 4) at the N-side of the battery unit 60 is simulated. Specifically, the switch MSW and the switch SW1 are closed. As a result, the coil of the auxiliary relay ASW is excited by the built-in battery 107, and the contact of the auxiliary relay ASW is closed. The connection state of the switch SW2 is established such that the fixed contact of the switch SW2 is connected to one of the movable contacts of the switch SW2, which is connected to the N-side connector terminal TN. The switch SW3A and the switch SW3B are opened. Thereby, a current path (represented by a bold line in FIG. 8) is formed from the N-side of the built-in battery 107 to the vehicle body frame 4 maintained at the ground potential via the switch SW2, the resistor Rg, the contact of the auxiliary relay ASW, the contactor connection terminal TG and the contactor 109. This current path simulates the ground leakage path (represented by the dashed line in FIG. 4) at the N-side of the battery unit 60. Also, between the N-side of the battery unit 60 and the vehicle body frame 4 maintained at the ground potential, the resistor Rg and the ground leakage detecting resistor Rn are connected in parallel. As compared to the "correct state" in which the switch SW1 and the auxiliary relay ASW are opened, impedance values between the both ends of the battery unit 60 and the vehicle body frame 4 are different. For this reason, currents which are different from those in the "correct state" flow through the ground leakage detecting resistors Rp, Rn, respectively. Accordingly, by confirming the activated state of the LED 544 and the activated state of the speaker 545 in the ground leakage detector 100, it can be confirmed whether or not the ground leakage detector 100 is operating correctly.

A modified example of the self-diagnostic operation of FIG. 7, which utilizes the voltage at the P-side of the built-in battery 107 mounted in the ground leakage detector 100, is similar to the exemplary self-diagnostic operation of FIG. 8, and therefore will not be described repeatedly.

As described above, in the self-diagnostic process, by utilizing the terminal voltage of the built-in battery 107 of the ground leakage detector 100 which is lower than the terminal voltage of the battery unit 60 of the electric motorcycle 1, rather than the terminal voltage of the battery unit 60, consumption of the electric power stored in the battery unit 60 can be lessened. Since the terminal voltage of the built-in battery 107 of the ground leakage detector 100 is lower than the terminal voltage of the battery unit 60 of the electric motorcycle 1, it becomes possible to lessen a current flowing when one of the electrodes of the built-in battery 107 and the vehicle body ground location are shorted via the contactor 109 in the self-diagnostic process. Thus, safety of the ground leakage detector 100 can be improved.

Modified Example

As the ground leakage detector 100, a fixed ground leakage detector installed on the ground may be used instead of the portable ground leakage detector which can be easily carried by the maintenance operator.

The location which the contactor 109 contacts in the detection of a ground leakage is not limited to the vehicle body frame 4, but may be any vehicle body ground location maintained at the ground potential, in the vehicle body.

The charging connector 49 of the electric motorcycle 1 and the connector 101 of the ground leakage detector 100 may be a transmission unit and a receiver unit in a non-contact charging method, instead of the method using the exposed connector pins.

In the ground leakage detector 100, instead of automatically switching the states of the switches (MSW, SW1, SW2, SW3A, SW3B), by the control unit 112, they may be manually switched. In other words, the switches (MSW, SW1, SW2, SW3A, SW3B) are not limited to semiconductor switches or electromagnetic relays, but may be hand-operated switches.

A predetermined termination condition used for terminating detection of a ground leakage may be such that a time that passes from when the detection of a ground leakage is initiated reaches a predetermined threshold, or another condition. For example, the termination condition may be such that the detecting operation of a ground leakage at the P-side and the N-side of the battery unit 60 is terminated or a ground leakage may be detected at the P-side or the N-side of the battery unit 60.

Although a ground leakage at both of the P-side and the N-side of the battery unit 60 is detectable, a ground leakage only at one of them may be detected. The ground leakage detector may be separate from the outside charger.

The ground leakage detector 100 may be activated by an outside electric power supply such as a power supply utility, instead of the built-in battery 107. For example, an AC/DC converter may convert the AC voltage of the outside electric power supply into the DC voltage and an internal circuit in the ground leakage detector 100 may operate by this DC voltage. In the embodiment of FIG. 8, a ground leakage can be sometimes detected without activating the charging relays (51, 52). In this case, the command for activating the charging relays (51, 52) may not be output to the vehicle body control unit 59 via the connector 101 and the charging connector 49.

Embodiment 2

In Embodiment 2 of the present invention, an outside control device including a connector which is electrically connectable to the charging connector of the electric motorcycle provides a control command to the vehicle body control unit via the charging connector, the system in the electric motorcycle is activated in response to this command, and thereby an in-vehicle ground leakage detector performs the operation for detecting whether or not there is a ground leakage. This outside control device has a part or all of the functions of the ground leakage detector 100 of Embodiment 1, described above, other than those associated with actual detection such as with the ground leakage detecting resistor and those associated with the alarm in the detection of the ground leakage.

The exemplary configuration of the electric system according to Embodiment 2 of the present invention is different from the exemplary configuration of the electric system according to Embodiment 1 shown in FIG. 2, in that the ground leakage detector 100 electrically connected to the charging connector 49 is replaced by the outside control device.

Figure 9:
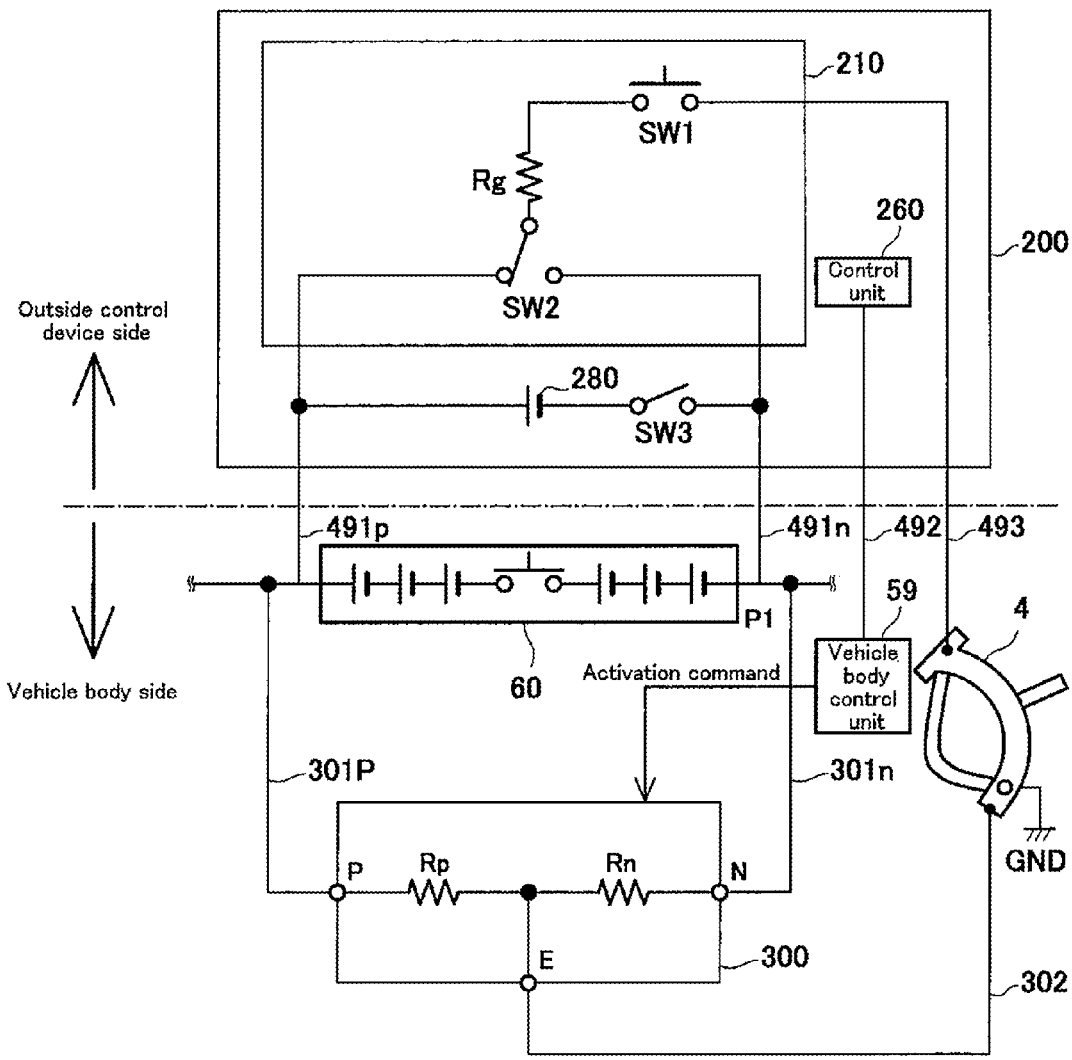
FIG. 9 is a block diagram showing an exemplary schematic configuration of an in-vehicle ground leakage detector and an exemplary schematic configuration of an outside control device according to Embodiment 2 of the present invention.

FIG. 9 is a block diagram showing exemplary circuit configurations of a ground leakage detecting system in the electric motorcycle side and the outside control device side, respectively, according to Embodiment 2 of the present invention. In FIG. 9, for simplified illustration, the charging connector 49 of the electric motorcycle and the connector of the outside control device are omitted.

Firstly, the configuration of the ground leakage detecting system of FIG. 9 will be described.

In the vehicle body side, an in-vehicle ground leakage detector 300 includes a P-side power supply terminal P connected to the P-side of the battery unit 60 via a high-voltage wire 301p, an N-side power supply terminal N connected to the N-side of the battery unit 60 via a high-voltage wire 301n, and a ground terminal E connected to the vehicle body frame 4 via a ground wire 302. The in-vehicle ground leakage detector 300 is configured such that the ground leakage detecting resistors Rp, Rn are connected in series between the P-side power supply terminal P and the N-side power supply terminal N and the connection point of ground leakage detecting resistors Rp, Rn is connected to the ground terminal E. In the in-vehicle ground leakage detector 300, in the case of the occurrence of a ground leakage, a current flows through the ground terminal E, and thereby currents which are different from those in the "correct state" flow through the ground leakage detecting resistors Rp, Rn, respectively. The in-vehicle ground leakage detector 300 determines whether or not there is a ground leakage by detecting a change in the currents. The in-vehicle ground leakage detector 300 is configured to determine whether or not there is a ground leakage in response to an activation command as a trigger from the vehicle body control unit 59, even before the system in the electric motorcycle 1 is activated, in addition to the normal ground leakage determination after the system in the electric motorcycle 1 is activated.

An outside control device 200 includes a control unit 260, a pseudo ground leakage circuit 210, a built-in battery 280, and a switch SW3 of the built-in battery 280.

The control unit 260 controls the overall outside control device 200. Especially, the control unit 260 outputs, to the vehicle body control unit 59, commands for opening and closing the contact of the P-side charging relay 51 and the contact of the N-side charging relay 52, in the detection of a ground leakage or in a diagnostic process. The control unit 260 includes a CPU, a DSP, a microcomputer, a logic circuit, or the like. The control unit 260 may be composed of a plurality of control units which cooperate with each other to perform distributed control.

The pseudo ground leakage circuit 210 is configured such that an SPST switch SW1, a resistor Rg, and a fixed contact and one of the movable contacts of an SPDT switch SW2 are connected in series between the P-side of the battery unit 60 and the vehicle body frame 4. Specifically, one of the fixed contacts of the switch SW1 is connected to one end of the resistor Rg, while the other fixed contact of the switch SW1 is electrically connected to the vehicle body frame 4 via a short test wire 493. The other end of the resistor Rg is connected to the fixed contact of the switch SW2. The two movable contacts of the switch SW2 are connected to the P-side and N-side of the battery unit 60, via the charging wires 491p, 491n, respectively.

When the switch SW3 is closed, the built-in battery 280 supplies a power supply voltage to internal circuits in the outside control device 200, such as the control unit 260 and the pseudo ground leakage circuit 210. Note that the terminal voltage of the built-in battery 280 is set lower than the terminal voltage of the battery unit 60.

Next, the exemplary operation of the ground leakage detecting system of FIG. 9 will be described.

In a case where the in-vehicle ground leakage detector 300 is activated and performs detection of a ground leakage, the outside control device 200 outputs, to the vehicle body control unit 59 via the charging connector 49, commands for activating the in-vehicle ground leakage detector 300 and for activating the charging relays (51, 52) to connect the charging connector 49 and the battery unit 60 to each other, in order to initiate detection of a ground leakage before the system in the electric motorcycle 1 is activated. In this state, the in-vehicle ground leakage detector 300 initiates detecting whether or not there is a ground leakage from one of the P-side and the N-side of the battery unit 60 to the vehicle body frame 4.

To utilize the terminal voltage of the battery unit 60 only for a period when the outside control device 200 is detecting whether or not there is a ground leakage, the outside control device 200 may output, to the vehicle body control unit 59 via the charging connector 49, commands for activating the charging relays (51, 52) to disconnect the charging connector 49 and the battery unit 60 from each other, when a predetermined termination condition is satisfied.

In a case where it is determined (diagnosed) whether or not in-vehicle ground leakage detector 300 is operating correctly, in the pseudo ground leakage circuit 210, the switch SW1 is closed and the fixed contact of the switch SW2 is connected to one of the movable contacts thereof. This causes the P-side or N-side of the battery unit 60 and the vehicle body ground location such as the vehicle body frame 4 to be shorted. At this time, by detecting a change in the currents flowing through the ground leakage detecting resistors Rp, Rn in the in-vehicle ground leakage detector 300, it can be determined whether or not the in-vehicle ground leakage detector 300 is operating correctly. In this case, instead of utilizing the terminal voltage of the battery unit 60 mounted in the electric motorcycle 1, the connector connection section (not shown) of Embodiment 1 may electrically disconnect the battery unit 60, and in this state, the terminal voltage of the built-in battery 107 mounted in the outside control device 200 may be utilized. This makes it possible to lessen consumption of the electric power stored in the battery unit 60.

Embodiment 3

The ground leakage detector of Embodiment 1 and the control device of Embodiment 2 may be mounted in an outside charger which is electrically connected to the charging connector of the electric motorcycle and charges the battery unit. Hereinafter, such an outside charger will be referred to as a charger with a ground leakage detecting function.

Figure 10:
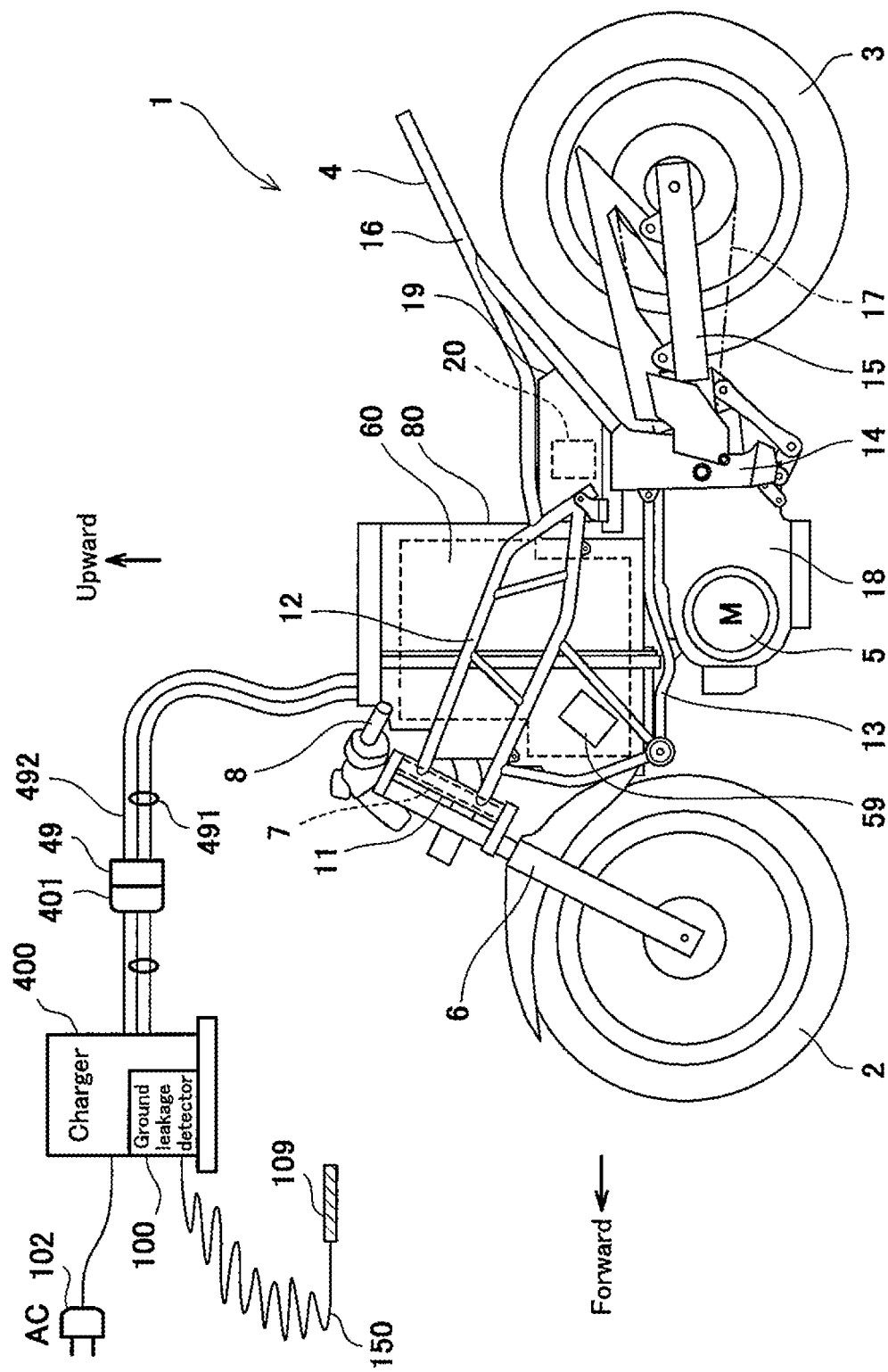
FIG. 10 is a view showing an exemplary configuration of an overall system according to Embodiment 3 of the present invention, including a charger with a ground leakage detecting function incorporating the ground leakage detector according to Embodiment 1 of the present invention.

For example, FIG. 10 is a view showing an exemplary configuration of the overall system according to Embodiment 3 of the present invention, including a charger with a ground leakage detecting function, incorporating the ground leakage detector according to Embodiment 1 of the present invention.

A charger 400 with a ground leakage detecting function of FIG. 10 incorporates the ground leakage detector 100, and a includes the cable 150 extended from the ground leakage detector 100, the contactor 109 attached to one end of the cable 150, a connector 401 fittable to the charging connector 49, and an attachment plug 102 connected to a socket (plug-in) of a power supply utility of AC 100V or the like. The charger 400 with a ground leakage detecting function of FIG. 10 has a structure of ground charging equipment or of ground transmission equipment for non-contact charging. The charger 400 with a ground leakage detecting function is owned by the user of the electric motorcycle 1 in a car parking area, placed in a service area called a charging stand or a charging spot, etc.

In accordance with the above described configuration, the connector of the charger 400 with a ground leakage detecting function which is electrically connectable to the charging connector 49 of the electric motorcycle 1 can be efficiently utilized. Therefore, it is not necessary to provide another connector intended for the ground leakage detector 100 or the outside control device 200. This makes it possible to lessen an effect on the configuration of the electric motorcycle 1 and simplify the configuration of the charger 400 with a ground leakage detecting function.

Since the charger 400 with a ground leakage detecting function is configured such that the ground leakage detector 100 or the outside control device 200 is integrated with the outside charger, it may notify occurrence of a ground leakage and restrict a charging operation when it determines that there is a ground leakage.

The charger 400 with a ground leakage detecting function may automatically detect whether or not there is a ground leakage when the charging is initiated or terminated. This makes it possible to automatically confirm whether or not the charging will be or has been performed correctly, when the charger 400 with a ground leakage detecting function initiates or terminates the charging of the battery unit 60. This is convenient to the maintenance operator.

Furthermore, the charger 400 with a ground leakage detecting function may regularly detect whether or not there is a ground leakage, in a state in which it is electrically connected to the charging connector 49 for a long period of time. This makes it possible to detect whether or not there is a ground leakage by efficiently utilizing the long period of time when the electric motorcycle 1 electrically connected to the charging connector 49 is in storage.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A ground leakage detector the present invention is effectively used to detect whether or not there is a ground leakage in a battery unit mounted in an electric vehicle, especially electric motorcycle.

REFERENCE CHARACTER LIST

1 . . . electric motorcycle
2 . . . front wheel
3 . . . rear wheel
4 . . . vehicle body frame
5 . . . electric motor
6 . . . front fork
7 . . . steering shaft
8 . . . handle
11 . . . head pipe
12 . . . main frame
13 . . . down frame
14 . . . pivot frame
15 . . . swing arm
16 . . . seat frame
17 . . . driving power transmission mechanism
18 . . . motor case
19 . . . inverter case
20 . . . inverter
80 . . . battery case
100 . . . ground leakage detector
101 . . . connector
102 . . . attachment plug
107 . . . built-in battery
108 . . . voltage detector
109 . . . contactor
112 . . . control unit
113 . . . detecting section
114 . . . operation determiner section
115 . . . counting section
116 . . . alarm unit
117 . . . LED 118 . . . speaker
150 . . . cable
MSW . . . switch
SW1, SW2 . . . switch
SW3A, SW3B . . . switch (connector connection section)
35 . . . anti-rush-current relay (second in-vehicle relay)
36 . . . P-side inverter relay (second in-vehicle relay)
37 . . . N-side inverter relay (second in-vehicle relay)
43 . . . low-voltage battery
45 . . . DC/DC converter
48 . . . DC/DC converter relay (second in-vehicle relay)
49 . . . charging connector
491 . . . charging wire
492 . . . communication wire
493 . . . short test wire
51 . . . P-side charging relay (first in-vehicle relay)
52 . . . N-side charging relay (first in-vehicle relay)
58 . . . battery monitoring unit
59 . . . vehicle body control unit
60 . . . battery unit
61 . . . battery module
62 . . . battery cell
63 . . . module casing
64 . . . battery frame
200 . . . control device
260 . . . control unit
280 . . . built-in battery
300 . . . in-vehicle ground leakage detector
400 . . . charger with a ground leakage detecting function

The invention claimed is:

1. A ground leakage detector for detecting a ground leakage in an electric vehicle including a battery, and a charging connector which is electrically connectable to a terminal member formed at one end of an outside electric wire through which electric power is supplied from outside to the battery, the ground leakage detector comprising:
 a connector connection section electrically connectable to the charging connector;
 a contactor configured to contact a vehicle body ground location in the electric vehicle; and
 a detecting circuit for detecting whether or not there is a ground leakage from the battery to the vehicle body ground location, based on a current flowing between the connector connection section and the contactor,
 wherein the detecting circuit includes a switch for performing switching between
 a state in which one of electrodes of the battery and the vehicle body ground location are shorted via the contactor, and the other of the electrodes is being opened; and
 a state in which one of the electrodes of the battery and the vehicle body ground location are not shorted via the contactor.

2. The ground leakage detector according to claim 1, wherein the electric vehicle includes:
 a first in-vehicle relay which is placed between the charging connector and the battery and connects the charging connector and the battery to each other or disconnects the charging connector and the battery from each other; and
 a vehicle body control unit for activating the first in-vehicle relay;
 wherein the charging connector and the connector connection section are configured such that the ground leakage detector and the vehicle body control unit are mutually communicable; and
 wherein the ground leakage detector is configured to output to the vehicle body control unit a command for activating the first in-vehicle relay to connect the charging connector and the battery to each other, via the connector connection section and the charging connector, when the detecting circuit is activated.

3. The ground leakage detector according to claim 1, wherein the switch is configured to perform switching between a first state in which one of the electrodes of the battery and the vehicle body ground location are shorted and the other of the electrodes of the battery is being opened, and
 a second state in which the other of the electrodes of the battery and the vehicle body ground location are shorted and one of the electrodes of the battery is being opened.

4. The ground leakage detector according to claim 3, wherein the switch includes:
 a positive-side switch which connects the vehicle body ground location and a positive electrode of the battery to each other or disconnects the vehicle body ground location and the positive electrode of the battery from each other;
 a negative-side switch which connects the vehicle body ground location and a negative electrode of the battery to each other or disconnects the vehicle body ground location and the negative electrode of the battery from each other; and
 a switch provided on a connection wire from which a first connection wire provided with the positive-side switch and a second connection wire provided with the negative-side switch branch at the vehicle body ground location, the switch being configured to perform switching between a state in which a terminal of the positive-side switch on the vehicle body ground location side and the vehicle body ground location are connected to each other, and a state in which a terminal of the negative-side switch on the vehicle body ground location side and the vehicle body ground location are connected to each other.

5. The ground leakage detector according to claim 1, comprising:
 a built-in battery in which a terminal voltage lower than a terminal voltage of the battery of the electric vehicle is set,
 wherein the detecting circuit detects whether or not there is a ground leakage, using the terminal voltage of the built-in battery as a power supply voltage.

6. A ground leakage detector for detecting a ground leakage in an electric vehicle including a battery, and a charging connector which is electrically connectable to a terminal member formed at one end of an outside electric wire through which electric power is supplied from outside to the battery, the ground leakage detector comprising:
 a connector connection section electrically connectable to the charging connector;
 a contactor configured to contact a vehicle body ground location in the electric vehicle; and
 a detecting circuit for detecting whether or not there is a ground leakage from the battery to the vehicle body ground location, based on a current flowing between the connector connection section and the contactor,
 wherein the detecting circuit includes:
 a switch for performing switching between a state in which one of electrodes of the battery and the vehicle body ground location are shorted via the contactor and a state in which one of electrodes of the battery and the vehicle body ground location are not shorted via the contactor; and an operation determiner section for determining whether or not the detecting circuit is operating correctly when one of electrodes of the battery and the vehicle body ground location are shorted by the switch.

7. The ground leakage detector according to claim 6, wherein the detecting circuit further includes:

a voltage source which is connected to the connector connection section in parallel with the battery and has a voltage lower than a terminal voltage of the battery; and wherein when the operation determiner section determines whether or not the detecting circuit is operating correctly, the detecting circuit is electrically disconnected from the battery via the charging connector and the connector connection section and causes one of electrodes of the voltage source and the vehicle body ground location to be shorted via the contactor.

8. A method of detecting, via a control device, a ground leakage in an electric vehicle including a battery, an in-vehicle ground leakage detector for detecting a ground leakage from the battery to a vehicle body ground location maintained at a ground potential, and a charging connector which is electrically connectable to a terminal member formed at one end of an outside electric wire through which electric power is supplied from outside to the battery and communicable with the in-vehicle ground leakage detector, the control device including a connector connection section which is electrically connectable to the charging connector and communicable with the in-vehicle ground leakage detector, the method comprising the steps of:

a step of electrically connecting the connector connection section to the charging connector;

the control device, with a step of transmitting an activation command to the in-vehicle ground leakage detector via the connector connection section and the charging connector;

the in-vehicle ground leakage detector, with a step of receiving the activation command from the control device;

the in-vehicle ground leakage detector, with a step of detecting whether or not there is a ground leakage from the battery to the vehicle body ground location;

the in-vehicle ground leakage detector, with a step of transmitting information indicative of a result of detection as to whether or not there is a ground leakage from the in-vehicle ground leakage detector to the control device via the charging connector and the connector connection section; and the control device, with a step of receiving the information indicative of the result of detection as to whether or not there is a ground leakage from the in-vehicle ground leakage detector via the charging connector and the connector connection section.

9. A method of detecting, via a ground leakage detector, a ground leakage in an electric vehicle including a battery, and a charging connector which is electrically connectable to a terminal member formed at one end of an outside electric wire through which electric power is supplied from outside to the battery, the ground leakage detector including a connector connection section electrically connectable to the charging connector and a contactor configured to contact a vehicle body ground location in the electric vehicle, the method comprising the steps of:

a step of electrically connecting the connector connection section to the charging connector;

a step of bringing the contactor into contact with the vehicle body ground location; and the ground leakage detector, with a step of detecting whether or not there is a ground leakage from the battery to the vehicle body ground location, based on a current flowing between the connector connection section and the contactor, wherein the detecting whether or not there is a ground leakage, comprises switching between a state in which one of electrodes of the battery and the vehicle body ground location are shorted via the contactor and the other of the electrodes is being opened, and a state in which one of the electrodes of the battery and the vehicle body ground location are not shorted via the contactor.

10. The method of detecting the ground leakage in the electric vehicle according to claim 9, wherein the ground leakage detector is electrically connected to the vehicle body ground location by bringing the contactor into contact with the vehicle body ground location.

11. The method of detecting the ground leakage in the electric vehicle according to claim 9, wherein the ground leakage detector is electrically connected to the vehicle body ground location via the charging connector by electrically connecting the connector connection section to the charging connector.

* * * * *